United States Patent
Watanabe et al.

(10) Patent No.: US 8,007,981 B2
(45) Date of Patent: Aug. 30, 2011

(54) RESIST COMPOSITION AND METHOD OF FORMING RESIST PATTERN

(75) Inventors: Ryoji Watanabe, Kawasaki (JP); Takehiro Seshimo, Kawasaki (JP); Takeshi Iwai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 530 days.

(21) Appl. No.: 11/997,527

(22) PCT Filed: Jul. 10, 2006

(86) PCT No.: PCT/JP2006/313710
§ 371 (c)(1), (2), (4) Date: Jan. 31, 2008

(87) PCT Pub. No.: WO2007/015352
PCT Pub. Date: Feb. 8, 2007

(65) Prior Publication Data
US 2010/0104972 A1 Apr. 29, 2010

(30) Foreign Application Priority Data
Aug. 3, 2005 (JP) ................. 2005-225805

(51) Int. Cl.
G03F 7/00 (2006.01)
G03F 7/004 (2006.01)
(52) U.S. Cl. ............... 430/270.1; 430/311; 430/913
(58) Field of Classification Search ............. 430/270.1, 430/311, 913
See application file for complete search history.

(56) References Cited

U.S. PATENT DOCUMENTS

| | | | |
|---|---|---|---|
| 5,258,257 A | 11/1993 | Sinta et al. | |
| 5,853,949 A * | 12/1998 | Kodama et al. | 430/191 |
| 5,945,517 A | 8/1999 | Nitta et al. | |
| 6,054,254 A | 4/2000 | Sato et al. | |
| 6,103,443 A * | 8/2000 | Wanat et al. | 430/191 |
| 6,153,733 A | 11/2000 | Yukawa et al. | |
| 6,214,748 B1 * | 4/2001 | Kobayashi et al. | 438/782 |
| 6,228,552 B1 * | 5/2001 | Okino et al. | 430/176 |
| 6,358,804 B2 * | 3/2002 | Kobayashi et al. | 438/301 |
| 6,731,857 B2 * | 5/2004 | Shelnut et al. | 385/143 |
| 6,787,286 B2 * | 9/2004 | Szmanda et al. | 430/270.1 |
| 6,906,851 B2 * | 6/2005 | Yuasa | 359/296 |
| 6,991,888 B2 * | 1/2006 | Padmanaban et al. | 430/270.1 |
| 7,084,236 B2 * | 8/2006 | Duineveld et al. | 528/397 |
| 7,205,087 B2 * | 4/2007 | Kavanagh et al. | 430/270.1 |
| 7,316,884 B2 * | 1/2008 | Ansai et al. | 430/270.1 |
| 7,329,479 B2 * | 2/2008 | Itoh et al. | 430/312 |
| 7,396,637 B2 * | 7/2008 | Itou et al. | 430/321 |
| 7,494,762 B2 * | 2/2009 | Irie et al. | 430/270.1 |
| 7,601,480 B2 * | 10/2009 | Rahman et al. | 430/270.1 |
| 2002/0015906 A1 | 2/2002 | Lee et al. | |
| 2003/0180662 A1 | 9/2003 | Nakano | |
| 2004/0110085 A1 | 6/2004 | Iwai et al. | |
| 2006/0054589 A1 * | 3/2006 | Omori et al. | 216/13 |
| 2006/0098926 A1 * | 5/2006 | Shelnut et al. | 385/129 |
| 2006/0145163 A1 * | 7/2006 | Tsujimura et al. | 257/79 |
| 2007/0172674 A1 * | 7/2007 | Nozaki et al. | 428/458 |
| 2008/0187860 A1 * | 8/2008 | Tsubaki et al. | 430/270.1 |

FOREIGN PATENT DOCUMENTS

| | | |
|---|---|---|
| EP | 0 834 770 A2 | 4/1998 |
| JP | 05-249673 | 9/1993 |
| JP | H09-208554 | 8/1997 |
| JP | 10-142799 | 5/1998 |
| JP | 10-186647 | 7/1998 |
| JP | H11-035551 | 2/1999 |
| JP | H11-035552 | 2/1999 |
| JP | H11-035573 | 2/1999 |
| JP | 11-72925 | 3/1999 |
| JP | H11-322707 | 11/1999 |
| JP | A-2000-136165 | 5/2000 |
| JP | 2001-294814 | 10/2001 |
| JP | 2002-53618 | 2/2002 |
| JP | 2003-241385 | 8/2003 |
| JP | 2003-253212 | 9/2003 |
| JP | 2003-344994 | 12/2003 |
| JP | A-2006-018017 | 1/2006 |
| JP | A-2006-113135 | 4/2006 |
| WO | WO 2004/074242 | 9/2004 |

OTHER PUBLICATIONS

Machine translation of JP 2003-344994 (no date).*
International Search Report in connection with corresponding PCT application No. PCT/JP2006/313710, dated Aug. 15, 2006.
Office Action issued in corresponding Japanese Patent Application No. 2005-225805, dated Jan. 11, 2011.

* cited by examiner

*Primary Examiner* — Amanda C. Walke
(74) *Attorney, Agent, or Firm* — Knobbe, Martens, Olson & Bear LLP

(57) ABSTRACT

A resist composition of the present invention is obtained by dissolving a resin component (A) that displays changed alkali solubility under action of acid and an acid generator component (B) that generates acid upon exposure in an organic solvent (S), wherein the organic solvent (S) includes an aromatic organic solvent (S1). According to the present invention, a resist composition and a method of forming a resist pattern, in which the level of LWR is reduced, can be provided.

6 Claims, No Drawings

RESIST COMPOSITION AND METHOD OF FORMING RESIST PATTERN

RELATED APPLICATIONS

This application is the U.S. National Phase filing under 35 U.S.C. §371 of PCT/JP2006/313710, filed Jul. 10, 2006, which designated the United States and was published in a language other than English, which claims priority under 35 U.S.C. §119(a)-(d) to Japanese Patent Application No. 2005-225805, filed Aug. 3, 2005. The content of these applications is incorporated herein by reference in their entireties.

TECHNICAL FIELD

The present invention relates to a resist composition and a method of forming a resist pattern.

Priority is claimed on Japanese Patent Application No. 2005-225805, filed Aug. 3, 2005, the content of which is incorporated herein by reference.

BACKGROUND ART

In lithography techniques, steps are performed in which, for example, a resist film comprising a resist composition is formed on a substrate, then selective exposure is performed on the resist film through a mask with a predetermined pattern by radiation such as light and electron beams, and developing is performed so as to form a resist pattern having a predetermined shape on the resist film.

Resist materials, in which the exposed portions are converted to be soluble in a developing solution, are referred to as the positive type, and resist materials, in which the exposed portions are converted to be insoluble in a developing solution, are referred to as the negative type.

In recent years, in the production of semiconductor elements and liquid crystal display elements, advances in lithography techniques have led to rapid progress in the field of miniaturization of patterns.

Typically, these miniaturization techniques involve shortening of the wavelength of the exposure light source. Conventionally, ultraviolet radiation such as g-lines or i-lines have been used, but currently, the mass production of semiconductor elements using KrF excimer lasers or ArF excimer lasers are starting.

Moreover, $F_2$ excimer lasers, electron beams, EUV (extreme ultraviolet), and X rays, whose wavelengths are shorter than those of the aforementioned excimer lasers, are also being examined.

Resist materials are required to have lithography properties such as sensitivity to the aforementioned light source and resolution which is high enough to reproduce patterns with very fine dimensions As resist materials which fulfill the aforementioned requirements, a chemically amplified resist is used, which includes a base resin that displays changed alkali solubility under action of acid and an acid generator that generates acid by exposure. For example, a chemically amplified positive resist includes a resin, in which the alkali solubility increases by the action of an acid, as a base resin; and an acid generator, and when an acid is generated from the acid generator by exposure in the formation of a resist pattern, the exposed portions are converted to an alkali soluble state.

Until recently, polyhydroxystyrene (PHS) or the resins (PHS-based resins) in which the hydroxyl groups have been protected with acid-dissociable, dissolution-inhibiting groups, which exhibit a high degree of transparency relative to a KrF excimer laser (248 nm), have been used as the base resin of chemically amplified resists. However, because PHS-based resins contain aromatic rings such as benzene rings, their transparency relative to light with a wavelength shorter than 248 nm, such as light of 193 nm, is inadequate. Accordingly, chemically amplified resists that use a PHS-based resin as the base resin component suffer from low levels of resolution in processes that use light of 193 nm.

As a result, resins that contain structural units derived from (meth)acrylate esters within the main chain (acrylic resins) are now widely used as the base resin for resists that use ArF excimer laser lithography or the like, as they offer excellent transparency in the vicinity of 193 nm (for example, see patent reference 1).

Also, as a solvent of resist compositions, a mixed solvent of propylene glycol monoalkyl ether acetate and ethyl lactate is used.

[Patent Reference 1] Japanese Unexamined Patent Application, First Publication No. 2003-241835

DISCLOSURE OF INVENTION

However, in conventional resist compositions, there is a problem in that line width roughness (hereafter abbreviated as LWR), which describes non-uniformity within the line width of a line pattern, occurs.

In particular, as the demands for resist patterns with higher resolution have increased in recent years, improvements in the level of LWR of resist patterns, which is formed after development, are strongly desired.

The present invention addresses the circumstances described above, with an object of providing a positive resist composition and a method of forming a resist pattern in which the level of LWR is reduced.

In order to achieve the aforementioned object, the present inventors provide the aspects described below.

That is, a first aspect of the present invention is a resist composition obtained by dissolving a resin component (A) that displays changed alkali solubility under action of acid and an acid generator component (B) that generates acid upon exposure in an organic solvent (S), wherein the organic solvent (S) comprises an aromatic organic solvent (S1).

Also, a second aspect of the present invention is a method of forming a resist pattern, including: forming a resist film on a substrate using a positive resist composition of the first aspect; exposing the resist film; and developing the resist film to form a resist pattern.

In this description and the appended claims, the term "exposure" is used as a general concept that includes irradiation with any form of radiation.

According to the present invention, it is possible to provide a resist composition and a method of forming a resist pattern in which the level of LWR is reduced.

BEST MODE FOR CARRYING OUT THE INVENTION

A positive resist composition of the present invention is obtained by dissolving a resin component (A) (hereafter referred to as component (A)) that displays changed alkali solubility under action of acid and an acid generator component (B) (hereafter referred to as component (B)) that generates acid upon exposure in an organic solvent (S) (hereafter referred to as component (S)).

<Component (A)>

There are no particular restrictions on the component (A) as long as it is a resin component that displays changed alkali solubility under action of acid, and one or more of the alkali-soluble resins, or resins that can be converted to an alkali-soluble state, that have been proposed as resins for chemically amplified resists can be used. The former case describes a so-called negative resist composition, and the latter case describes a so-called positive resist composition.

In the case of a negative composition, a cross-linking agent is added to the resist composition together with the alkali-soluble resin and the component (B). Then, during resist pattern formation, when acid is generated from the component (B) upon exposure, the action of this acid causes cross-linking to occur between the alkali-soluble resin and the cross-linking agent, causing the composition to become alkali-insoluble.

As the alkali-soluble resin, resins containing structural units derived from at least one compound selected from amongst α-(hydroxyalkyl)acrylic acids and lower alkyl esters of α-(hydroxyalkyl)acrylic acids enable the formation of resist patterns with minimal swelling, and are consequently preferred. Herein, α-(hydroxyalkyl)acrylic acids represent one or both of acrylic acids, in which a hydrogen atom is bonded to the α-position carbon atom, to which a carboxyl group is bonded, and α-hydroxyalkylacrylic acids, in which a hydroxyalkyl group is bonded to the α-position carbon atom.

Furthermore, as the cross-linking agent, typically the use of an amino-based cross-linking agent such as a glycoluril containing a methylol group or alkoxymethyl group, and particularly a methoxymethyl group or a butoxymethyl group, enables the formation of a resist pattern with minimal swelling, and is consequently preferred. The blend quantity of the cross-linking agent is preferably within a range of 1 to 50 parts by mass per 100 parts by mass of the alkali-soluble resin.

In the case of a positive composition, the component (A) is an alkali-insoluble compound containing so-called acid-dissociable, dissolution-inhibiting groups, and when acid is generated from the component (B) upon exposure, this acid causes the acid-dissociable, dissolution-inhibiting groups to dissociate, causing the component (A) to become alkali-soluble.

Consequently, during resist pattern formation, by selectively exposing the resist composition applied to the surface of the substrate, the alkali solubility of the exposed portions is increased, meaning that alkali developing can then be conducted.

In the present invention, positive resist compositions are preferable.

Preferable examples of the composition (A) used in positive resist compositions include a polyhydroxystyrene-based resin and an acrylate ester-based resin.

Hereafter, as the component (A) which is preferably used in chemically amplified resist compositions, the resin components, which are preferably used in lithography using ArF excimer lasers, are described with reference to the examples.

The component (A), which is preferably used as a resin for ArF excimer lasers, is preferably a copolymer which includes a structural unit (a1) derived from an acrylate ester containing an acid-dissociable, dissolution-inhibiting group; and a structural unit (a2) derived from an acrylate ester containing a lactone-containing cyclic group.

Furthermore, the aforementioned copolymer is preferably a copolymer (A1) which includes a structural unit (a3) derived from an acrylate ester containing a polar group-containing aliphatic hydrocarbon group.

In addition, the component (A) may include a resin other than the copolymer (A1), or, may include only the copolymer (A1).

The ratio of the copolymer (A1) in the component (A) is preferably 50 mass % or higher, more preferably 80 to 100 mass %, and most preferably 100 mass %.

As the copolymer (A1) within the component (A), either a single type thereof may be used alone, or a combination of two or more different types thereof may be used.

In this description and the appended claims, a "structural unit derived from an acrylate ester" refers to a structural unit formed by cleavage of the ethylenic double bond of an acrylate ester.

The term "acrylate ester" is a general concept that includes not only the acrylate ester in which a hydrogen atom is bonded to the α-position carbon atom, but also structures in which a substituent group (an atom or group other than a hydrogen atom) is bonded to the α-position carbon atom. Examples of suitable substituent groups include a halogen atom, a lower alkyl group or a halogenated lower alkyl group. Examples of a halogen atom include a fluorine atom, a chlorine atom, a bromine atom, and an iodine atom, and a fluorine atom is particularly preferable.

The term "α-position (α-position carbon atom)" in a structural unit derived from an acrylate ester, unless stated otherwise, refers to the carbon atom to which the carboxyl group is bonded.

The term "alkyl group", unless stated otherwise, includes linear, branched, and cyclic monovalent saturated hydrocarbon groups.

The term "lower alkyl group" refers to an alkyl group having 1 to 5 carbon atoms.

The term "halogenated lower alkyl group" refers to the aforementioned lower alkyl group in which at least one or all of hydrogen atoms are substituted with the aforementioned halogen atoms.

In the acrylate ester, specific examples of the lower alkyl group as the substituent group at the α-position include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group.

In the present invention, it is preferable that a hydrogen atom, a halogen atom, a lower alkyl group, or a halogenated lower alkyl group be bonded to the α-position of the acrylate ester, and it is more preferably that a hydrogen atom, a fluorine atom, a lower alkyl group, or a fluorinated lower alkyl group be bonded. In terms of industrial availability, a hydrogen atom or a methyl group is particularly preferable.

Structural Unit (a1)

The structural unit (a1) is a structural unit derived from an acrylate ester having an acid-dissociable, dissolution-inhibiting group.

The acid-dissociable, dissolution-inhibiting group within the structural unit (a1) may be any of those proposed as acid-dissociable, dissolution-inhibiting groups of the base resins for conventional chemically amplified resists, as long as it exhibits alkali-dissolution inhibiting property to render the entire copolymer (A1) alkali insoluble prior to dissolution, and changes the entire compound (A1) alkali soluble following dissociation.

Typically, groups, which form a cyclic or linear tertiary alkyl ester, or cyclic or linear alkoxyalkyl ester, with the carboxyl group of a (meth)acrylic acid, are widely known. Herein, the term "(meth)acrylate ester" is a generic term that includes either or both of the acrylate ester having a hydrogen atom bonded to the α-position and the methacrylate ester having a methyl group bonded to the α-position.

Here, the term "tertiary alkyl ester" is a structure in which the hydrogen atom of a carboxyl group is substituted with a linear or cyclic alkyl group to form an ester, and the tertiary carbon atom of the linear or cyclic alkyl group is bonded to the terminal oxygen atom of the carbonyloxy group (—C(O)—O—). When acid acts on the tertiary alkyl ester, the bond between the oxygen atom and the tertiary carbon atom is broken.

Herein, the linear or cyclic alkyl group may have a substituent group.

Hereafter, for the sake of convenience, a group, which forms a tertiary alkyl ester with a carboxyl group so as to be acid-dissociable, is referred to as a "tertiary alkyl ester-type acid-dissociable, dissolution-inhibiting group".

Further, the term "cyclic or linear alkoxyalkyl ester" is a structure in which the hydrogen atom of a carboxyl group is substituted with a cyclic alkoxyalkyl group to form an ester, and the alkoxyalkyl group is bonded to the terminal oxygen atom of the carbonyloxy group (—C(O)—O—). When acid acts on the alkoxyalkyl ester, the bond between the oxygen atom and the alkoxyalkyl group is broken.

As the structural unit (a1), it is preferable to use at least one member selected from the group consisting of structural units represented by formula (a1-0-1) shown below and structural units represented by formula (a1-0-2) shown below.

[Chemical Formula 1]

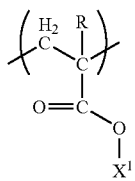

(a1-0-1)

(wherein R represents a hydrogen atom, a halogen atom, a lower alkyl group, or a halogenated lower alkyl group; and $X^1$ represents an acid-dissociable, dissolution inhibiting-group.)

[Chemical Formula 2]

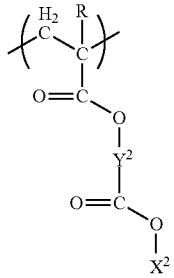

(a1-0-2)

(wherein R represents a hydrogen atom, a halogen atom a lower alkyl group, or a halogenated lower alkyl group; $X^2$ represents an acid-dissociable, dissolution-inhibiting group; and $Y^2$ represents an alkylene group or an aliphatic cyclic group.)

In general formula (a1-0-1), the halogen atom, the lower alkyl group, or the halogenated lower alkyl group for R are the same as the halogen atom, the lower alkyl group, or the halogenated lower alkyl group which can be bonded to the α-position of the aforementioned acrylate ester.

$X^1$ and $X^2$ are not particularly limited as long as they are an acid-dissociable, dissolution-inhibiting group. Examples thereof include alkoxyalkyl groups and tertiary alkyl ester-based acid-dissociable, dissolution-inhibiting groups, and a tertiary alkyl ester-based acid-dissociable, dissolution-inhibiting group is preferable. Examples of tertiary alkyl ester-based acid dissociable, dissolution inhibiting groups include aliphatic branched acid-dissociable, dissolution-inhibiting groups and aliphatic cyclic group-containing acid-dissociable, dissolution-inhibiting groups.

An acid-dissociable, dissolution-inhibiting group preferably has 4 to 30 carbon atoms.

In this description and the appended claims, the term "aliphatic" is a relative concept used in relation to the term "aromatic", and defines a group or compound that has no aromaticity. The term "aliphatic cyclic group" refers to a monocyclic group or polycyclic group that has no aromaticity.

The "aliphatic cyclic group" within the structural unit (a1) may or may not have a substituent group. Examples of a substituent group include lower alkyl groups having 1 to 5 carbon atoms, a fluorine atom, fluorinated lower alkyl groups having 1 to 5 carbon atoms which are lower alkyl groups substituted with fluorine atoms, and an oxygen atom (=O).

The basic ring of the "aliphatic cyclic group" exclusive of substituent groups is not limited to a group made of only carbon and hydrogen (i.e. a hydrocarbon group), but is preferably a hydrocarbon group. Further, the "hydrocarbon group" may be either saturated or unsaturated, but is preferably saturated. Furthermore, the hydrocarbon group is preferably a polycyclic group.

An aliphatic cyclic group preferably has 6 to 12 carbon atoms.

Examples of such aliphatic cyclic groups include groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom, or a fluorinated lower alkyl group. Specific examples thereof include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

An aliphatic branched acid-dissociable, dissolution-inhibiting group preferably has 4 to 8 carbon atoms, and examples thereof include a tert-butyl group and tert-amyl group.

Examples of the aliphatic cyclic group-containing acid-dissociable, dissolution-inhibiting group include a group which has a tertiary carbon atom on the ring structure of the cycloalkyl group, and specific examples thereof include a 2-methyl-2-adamantyl group and a 2-ethyl-2-adamantyl group. Further, specific examples include groups having an aliphatic cyclic group such as an adamantyl group and a branched alkylene group having a tertiary carbon atom bonded thereto, as in the structural unit represented by general formula shown below.

[Chemical Formula 3]

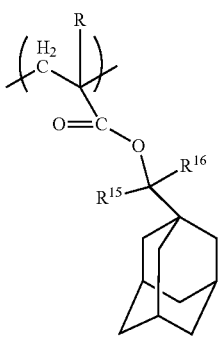

(wherein R represents the same as the aforementioned; and $R^{15}$ and $R^{16}$ each independently represents an alkyl group (which may be linear or branched, and preferably has 1 to 5 carbon atoms).)

Further, as the alkoxyalkyl group, groups represented by general formula shown below are preferable.

[Chemical Formula 4]

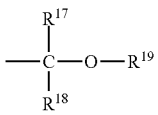

(wherein $R^{17}$ and $R^{18}$ each independently represents a linear or branched alkyl group, or a hydrogen atom; and $R^{19}$ represents a linear, branched, or cyclic alkyl group; or the terminals of $R^{17}$ and $R^{19}$ may be bonded so as to form a ring.)

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly preferable that either one of $R^{17}$ and $R^{18}$ be a hydrogen atom and the other be a methyl group.

$R^{19}$ represents a linear, branched, or cyclic alkyl group which preferably has 1 to 15 carbon atoms, and may has any of linear, branched, or cyclic form.

When $R^{19}$ has a linear or branched form, it preferably has 1 to 5 carbon atoms, is more preferably an ethyl group or a methyl group, and is most preferably an ethyl group.

When $R^{19}$ has a cyclic form, it preferably has 4 to 15 carbon atoms, more preferably 4 to 12 carbon atoms, and most preferably 5 to 10 carbon atoms.

Examples thereof include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples thereof include groups in which one or more hydrogen atoms have been removed from monocycloalkanes such as cyclopentane and cyclohexane, and groups in which one or more hydrogen atoms have been removed from polycycloalkanes such as adamantane, norbornane, isobornane, tricyclodecane and tetracyclododecane. Of these, a group in which one or more hydrogen atoms have been removed from adamantane is preferable.

In the above formula, $R^{17}$ and $R^{19}$ may each independently represent an alkylene group of 1 to 5 carbon atoms, and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

In general formula (a1-0-2), R represents the same as the aforementioned. $X^2$ represents the same as $X^1$ in formula (a1-0-1).

$Y^2$ preferably represents an alkylene group having 1 to 4 carbon atoms or a divalent aliphatic cyclic group.

When $Y^2$ represents a divalent aliphatic cyclic group, the same as those exemplified above in connection with the explanation of "aliphatic cyclic group" in the aforementioned structural unit (a1), in which two hydrogen atoms have been removed therefrom, can be used.

Specific examples of the structural unit (a1) include structural units represented by general formulas (a1-1) to (a1-4) shown below.

[Chemical Formula 5]

(a1-1)

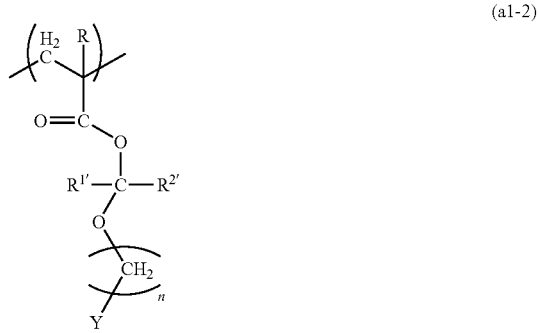
(a1-2)

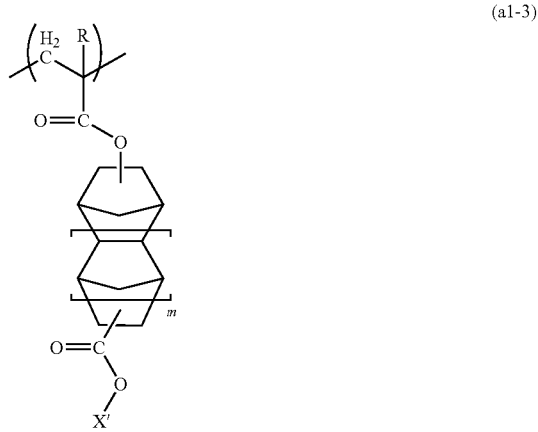
(a1-3)

-continued (a1-4)

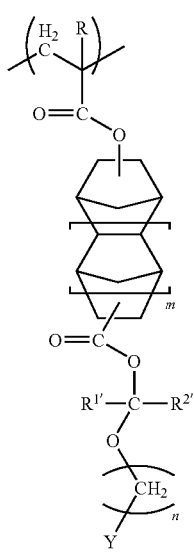

(wherein X' represents a tertiary alkyl ester-based acid-dissociable, dissolution-inhibiting group; Y represents a lower alkyl group having 1 to 5 carbon atoms or an aliphatic cyclic group; n represents an integer of 0 to 3; m represents 0 or 1; R represents the same as the aforementioned; and $R^{1'}$ and $R^{2'}$ each independently represents a hydrogen atom or a lower alkyl group having 1 to 5 carbon atoms.)

It is preferable that at least one of $R^{1'}$ and $R^{2'}$ represent a hydrogen atom, and it is more preferable that both of $R^{1'}$ and $R^{2'}$ represent a hydrogen atom. n preferably represents 0 or 1.

X' represents the same as the tertiary alkyl ester-based acid-dissociable, dissolution-inhibiting groups exemplified above for $X^1$.

Examples of the aliphatic cyclic group represented by Y are the same as those exemplified above in connection with the explanation of an "aliphatic cyclic group".

Specific examples of structural units represented by general formula (a1-1) to (a1-4) are shown below.

[Chemical Formula 6]

(a1-1-1)

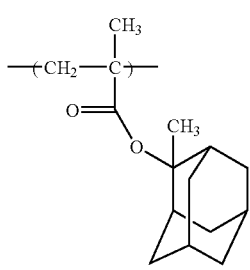

(a1-1-2)

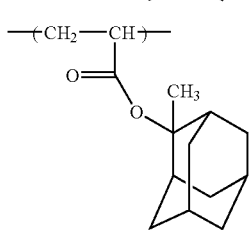

-continued (a1-1-3)

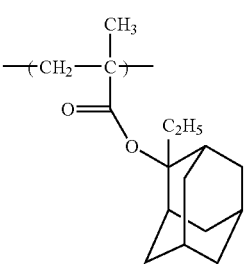

(a1-1-4)

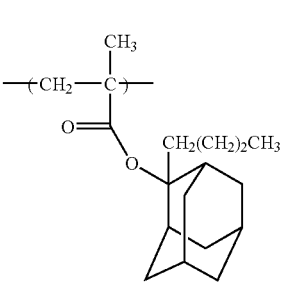

(a1-1-5)

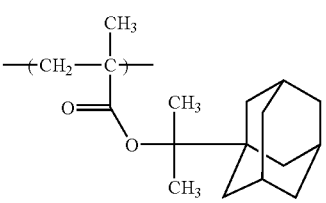

(a1-1-6)

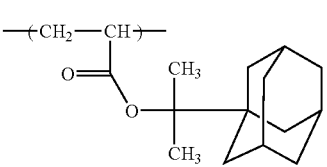

(a1-1-7)

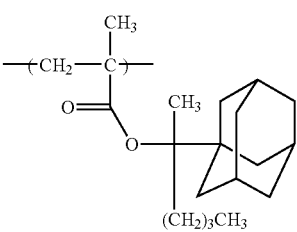

(a1-1-8)

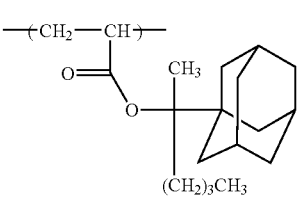

(a1-1-9)

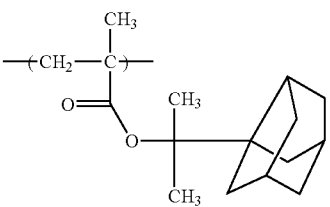

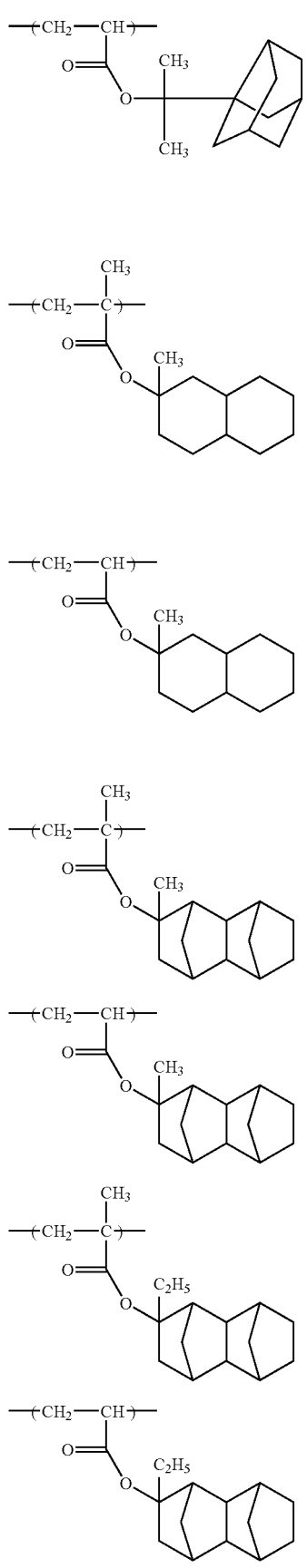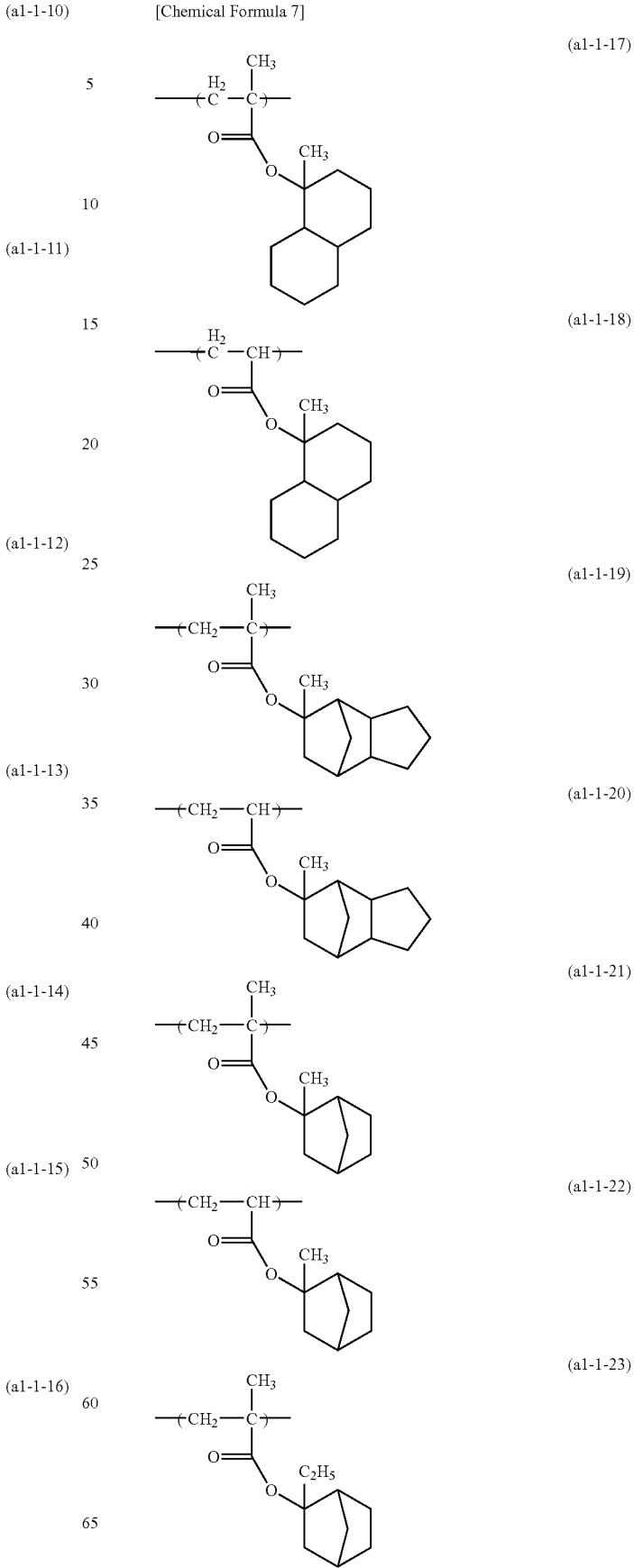

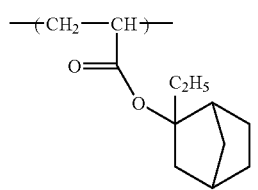 (a1-1-24)
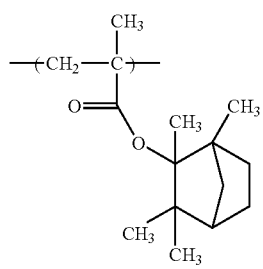 (a1-1-25)
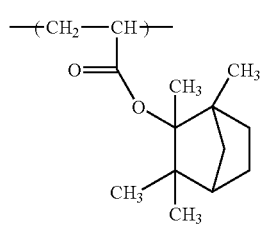 (a1-1-26)
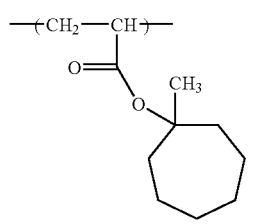 (a1-1-27)
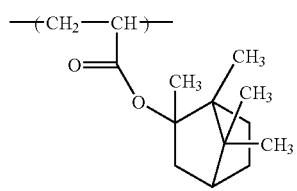 (a1-1-28)
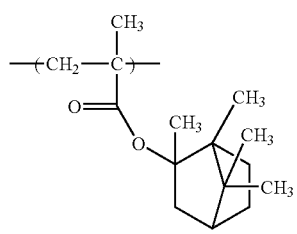 (a1-1-29)
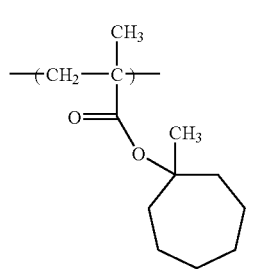 (a1-1-30)
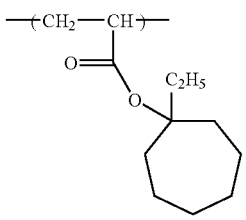 (a1-1-31)
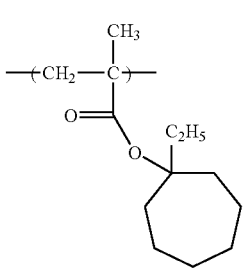 (a1-1-32)
[Chemical Formula 8]
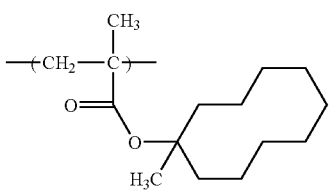 (a1-1-33)
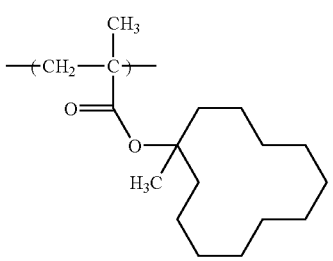 (a1-1-34)
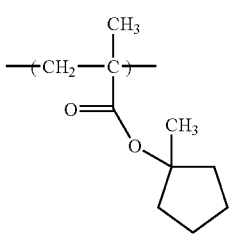 (a1-1-35)
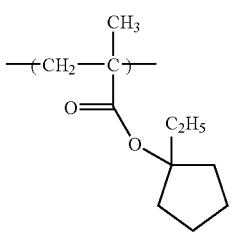 (a1-1-36)

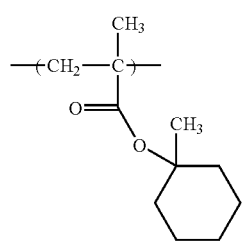 (a1-1-37)
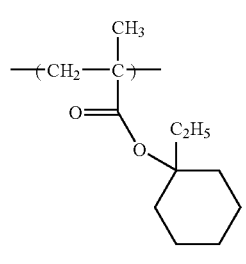 (a1-1-38)
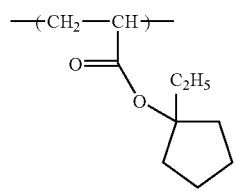 (a1-1-39)
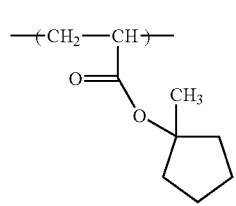 (a1-1-40)
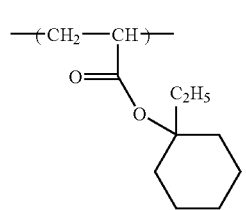 (a1-1-41)
[Chemical Formula 9]
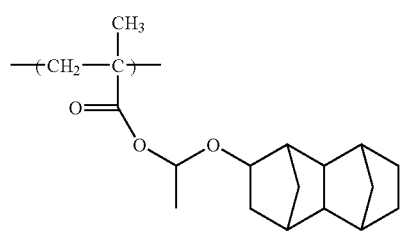 (a1-2-1)
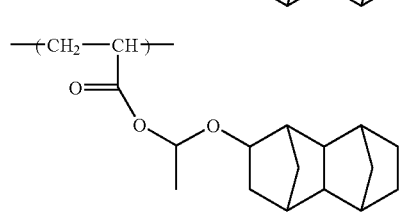 (a1-2-2)
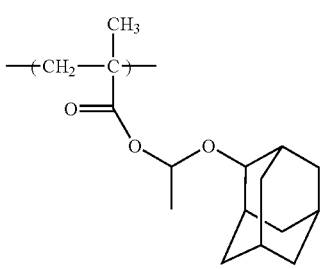 (a1-2-3)
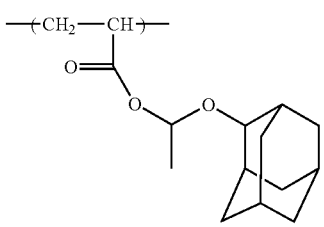 (a1-2-4)
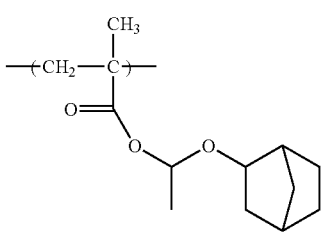 (a1-2-5)
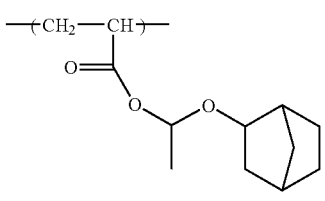 (a1-2-6)
[Chemical Formula 10]
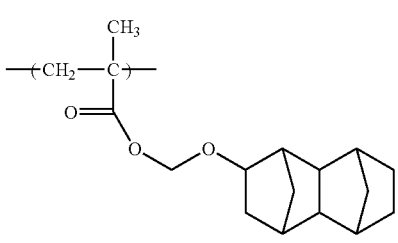 (a1-2-7)
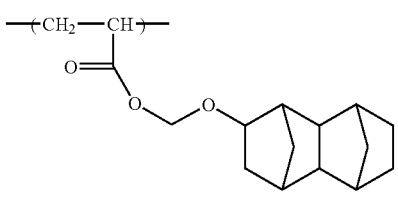 (a1-2-8)
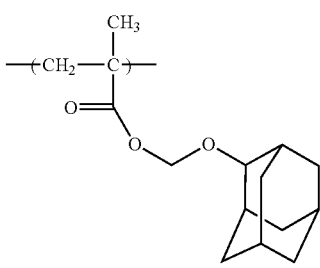 (a1-2-9)

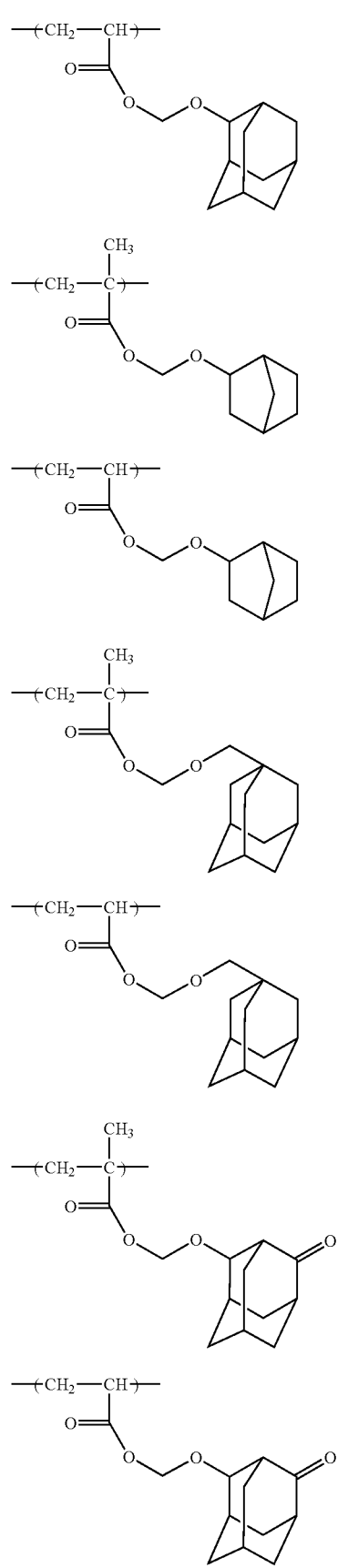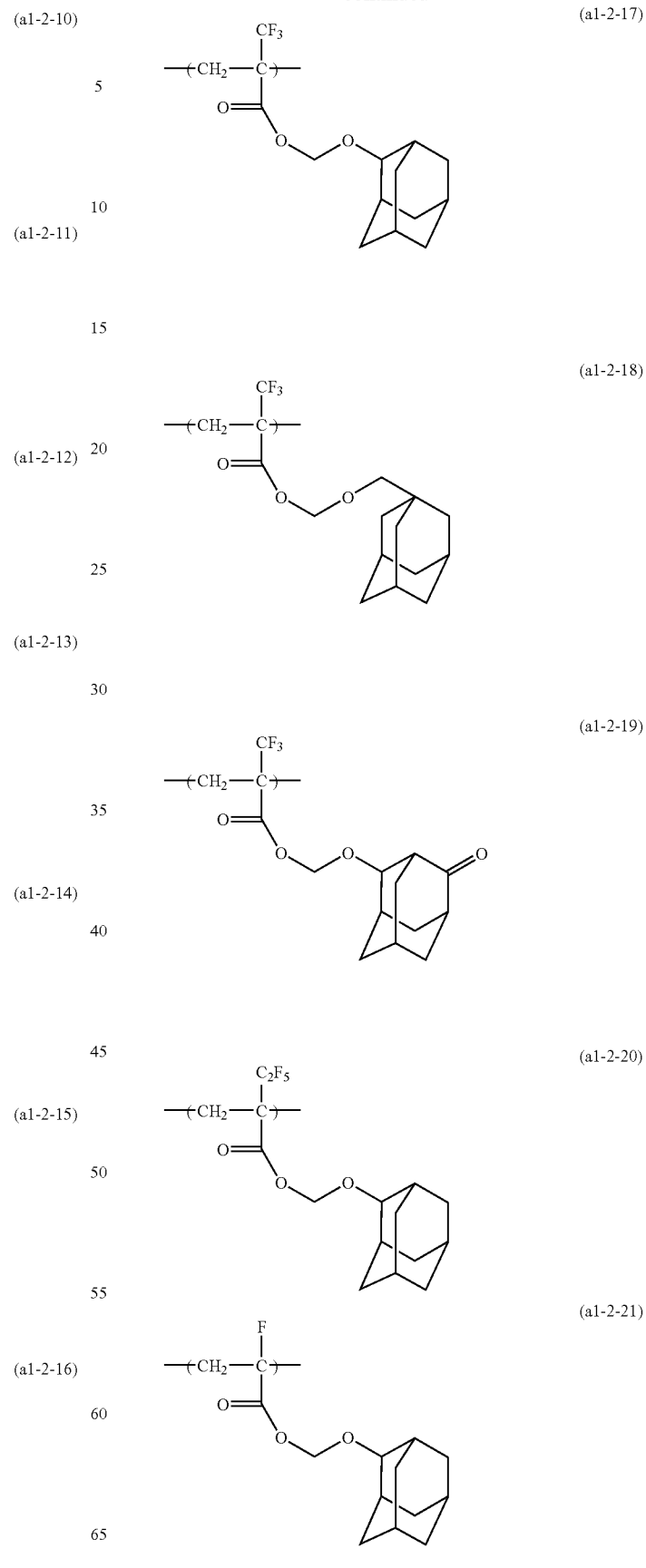

[Chemical Formula 11]
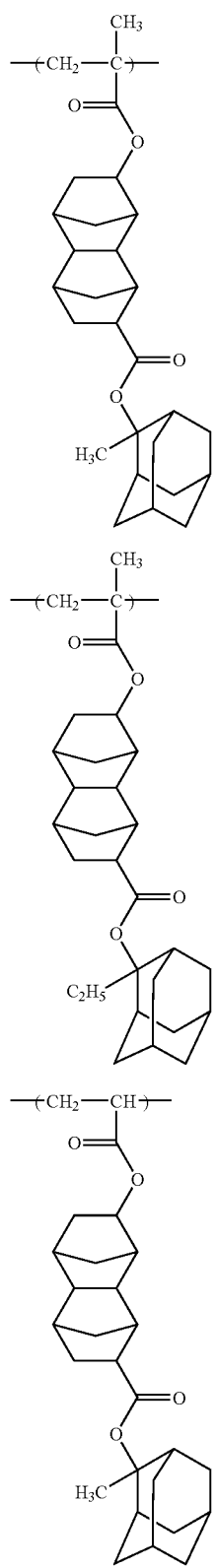
(a1-3-1)
(a1-3-2)
(a1-3-3)
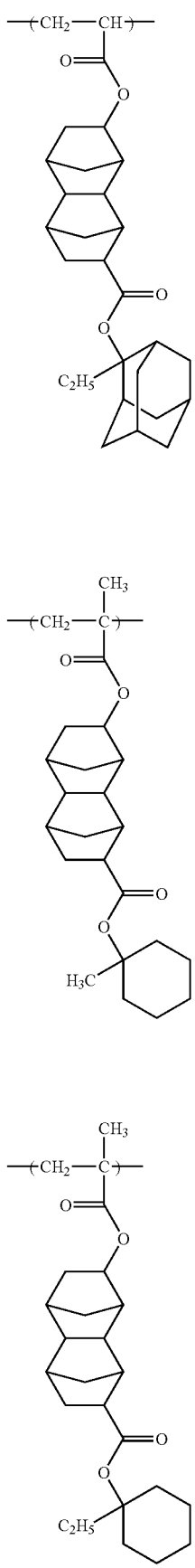
(a1-3-4)
(a1-3-5)
(a1-3-6)

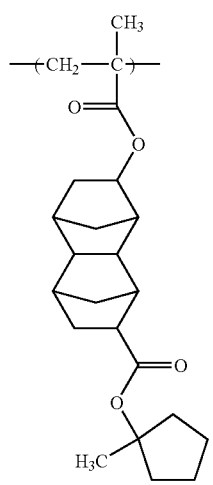
(a1-3-7)
(a1-3-8)
(a1-3-9)
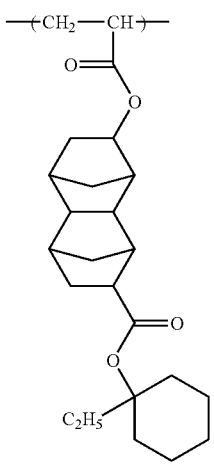
(a1-3-10)
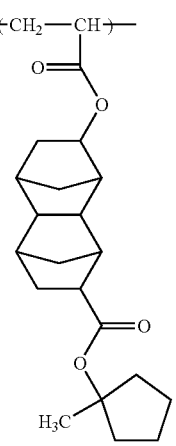
(a1-3-11)
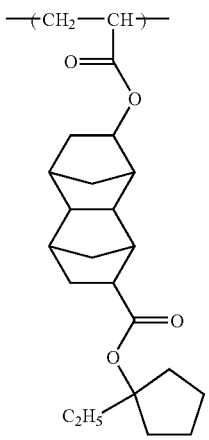
(a1-3-12)

[Chemical Formula 12]
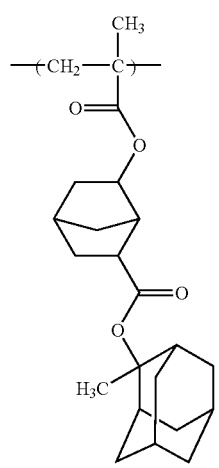
(a1-3-13)
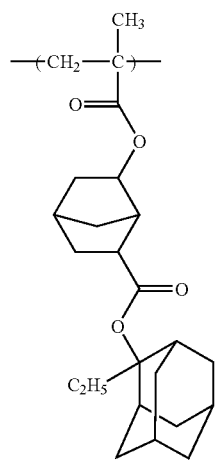
(a1-3-14)
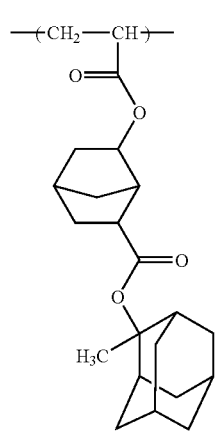
(a1-3-15)
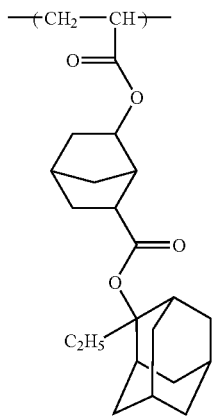
(a1-3-16)
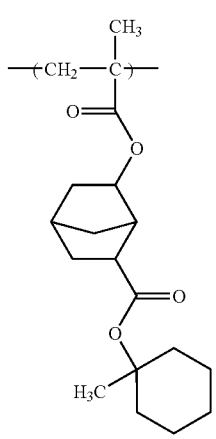
(a1-3-17)
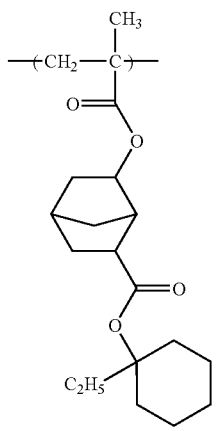
(a1-3-18)
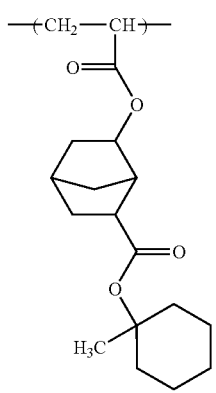
(a1-3-19)

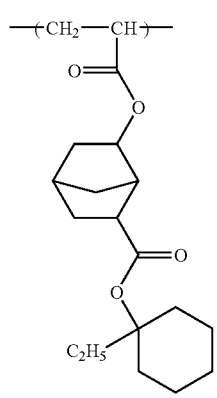
(a1-3-20)
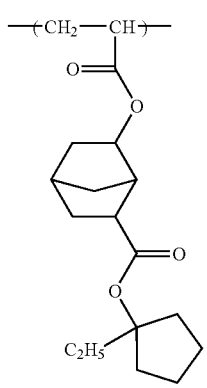
(a1-3-24)
[Chemical Formula 13]
(a1-3-21)
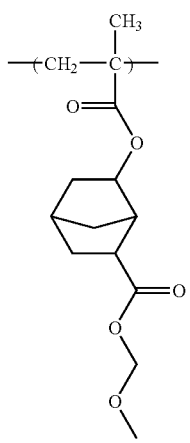
(a1-4-1)
(a1-3-22)
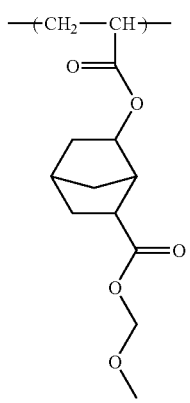
(a1-4-2)
(a1-3-23)

(a1-4-3) 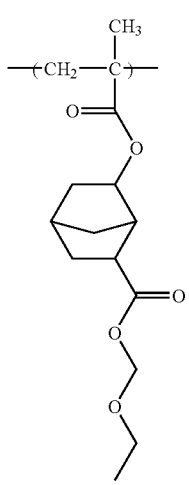
(a1-4-4) 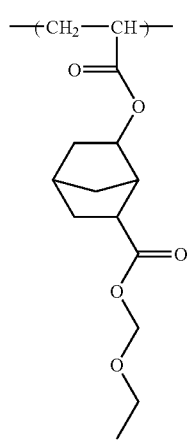
(a1-4-5) 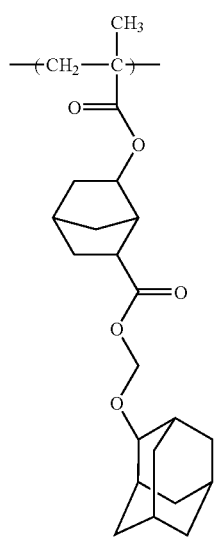
(a1-4-6) 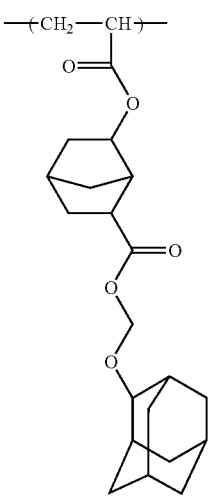
(a1-4-7) 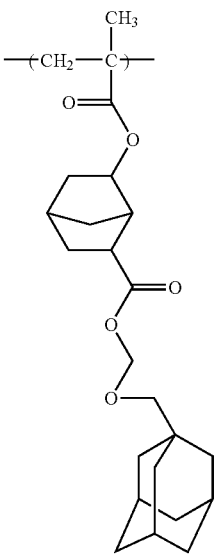
(a1-4-8) 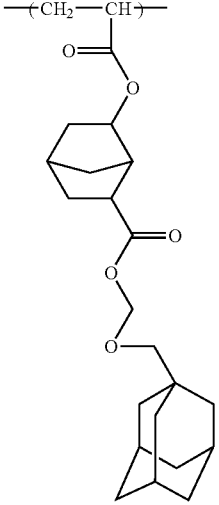

(a1-4-9) 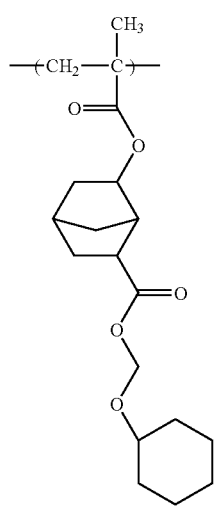
(a1-4-12) 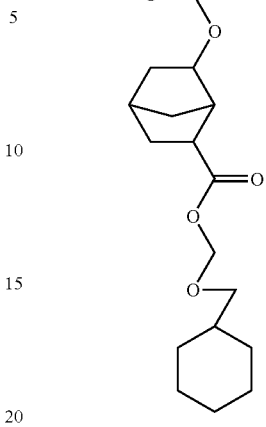
(a1-4-10) 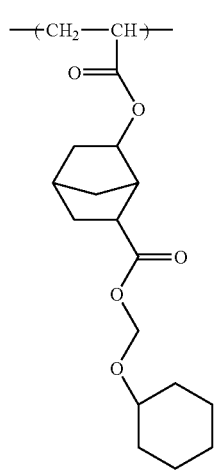
(a1-4-13) 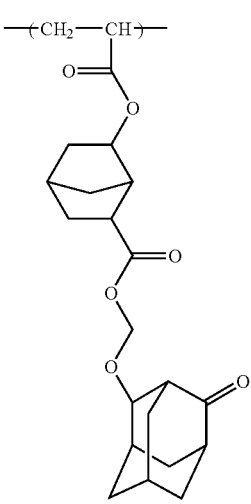
(a1-4-11) 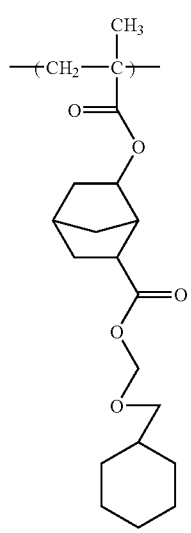
(a1-4-14) 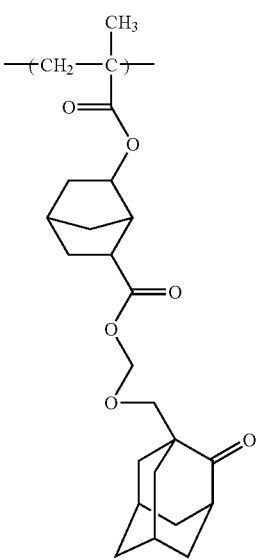

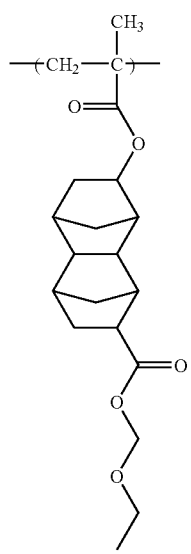 (a1-4-15)
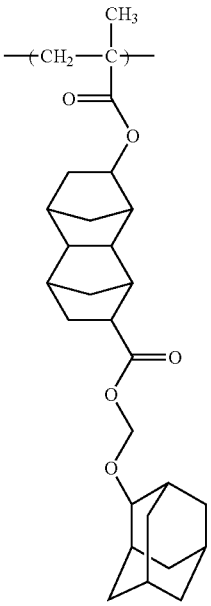 (a1-4-17)
[Chemical Formula 14]
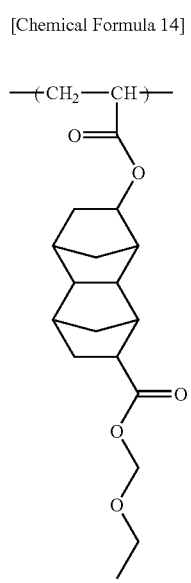 (a1-4-16)
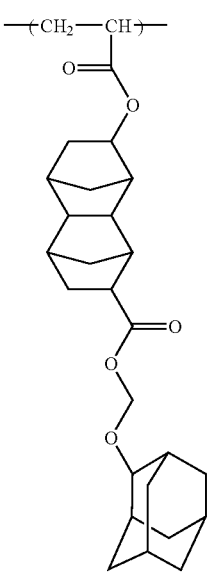 (a1-4-18)

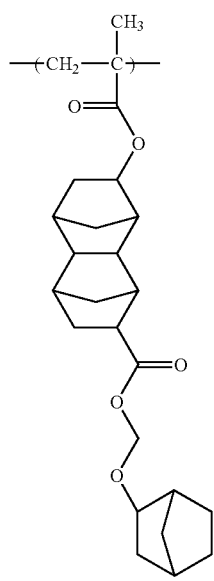
(a1-4-19)
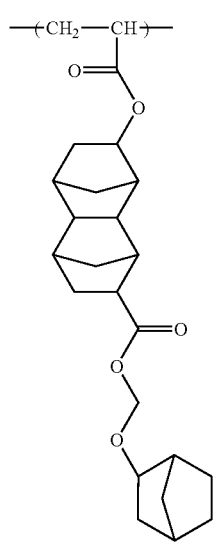
(a1-4-20)
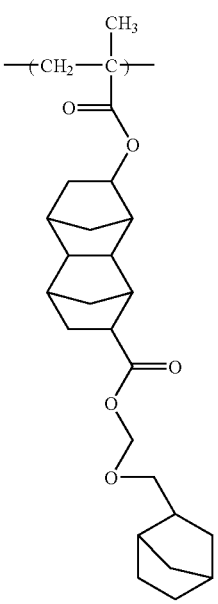
(a1-4-21)
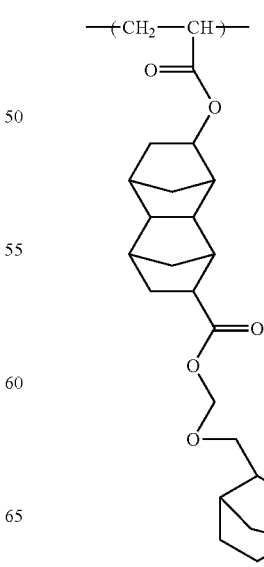
(a1-4-22)

(a1-4-23)
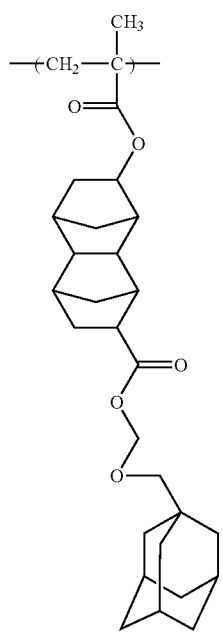
(a1-4-25)
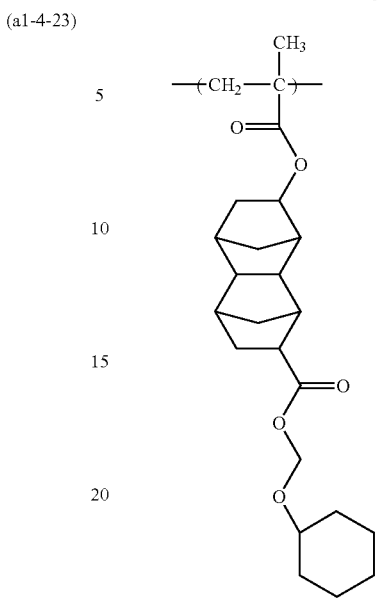
(a1-4-24)
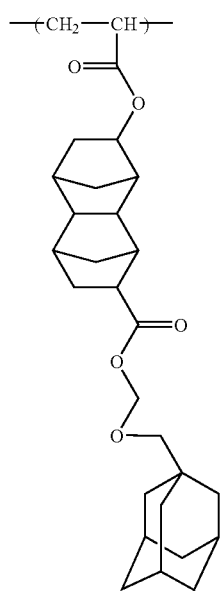
(a1-4-26)
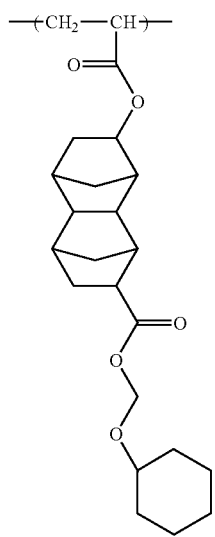

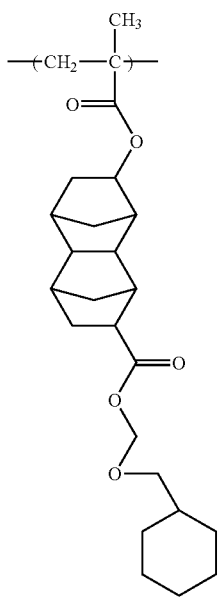 (a1-4-27)

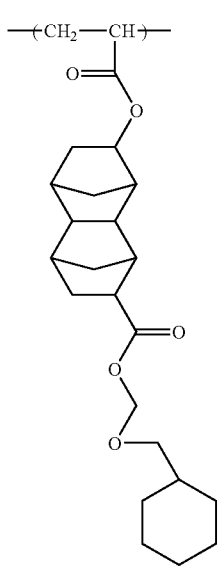 (a1-4-28)

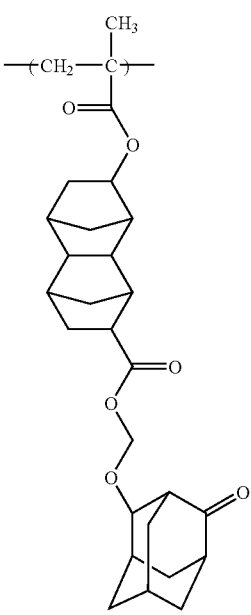 (a1-4-29)

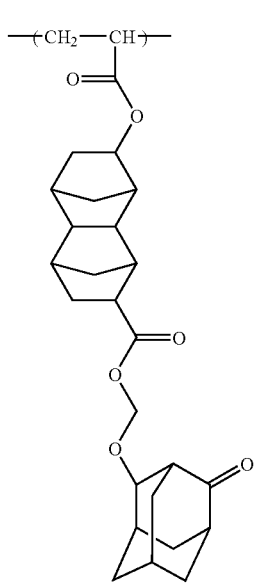 (a1-4-30)

As the structural unit (a1), either a single type thereof may be used alone, or a combination of two or more different types thereof may be used. Of these, structural units represented by general formula (a1-1) are preferable. More specifically, at least one structural unit selected from the group consisting of structural units represented by formulas (a1-1-1) to (a-1-6) and (a1-1-35) to (a1-1-41) is more preferable.

Further, as the structural unit (a1), structural units represented by general formula (a1-1-01) shown below which includes the structural units represented by formulas (a1-1-1) to (a1-1-4), and structural units represented by general formula (a1-1-02) shown below which includes the structural units represented by formulas (a1-1-36), (a1-1-38), (a1-1-39), and (a1-1-41) are preferable.

[Chemical Formula 15]

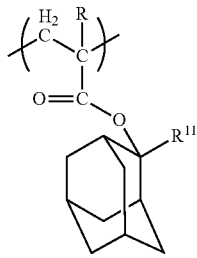

(a1-1-01)

(wherein R represents a hydrogen atom, a halogen atom, a lower alkyl group, or a halogenated lower alkyl group; and $R^{11}$ represents a lower alkyl group.)

[Chemical Formula 16]

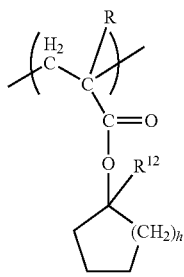

(a1-1-02)

(wherein R represents a hydrogen atom, a halogen atom, a lower alkyl group, or a halogenated lower alkyl group; $R^{12}$ represents a lower alkyl group; and h represents an integer of 1 to 3.)

In general formula (a1-1-01), R represents the same as the aforementioned. The lower alkyl group represented by $R^{11}$ is the same as the lower alkyl group represented by the aforementioned R. $R^{11}$ preferably represents a methyl group or an ethyl group.

In genera formula (a1-1-02), R represents the same as the aforementioned. The lower alkyl group represented by $R^{12}$ is the same as the lower alkyl group represented by the aforementioned R. $R^{12}$ preferably represents a methyl group or an ethyl group, and most preferably a methyl group. h preferably represents 1 or 2, and most preferably 2.

In the copolymer (A1), the amount of the structural unit (a1) based on the combined total of all structural units constituting the copolymer (A1) is preferably 10 to 80 mol %, more preferably 20 to 70 mol %, and still more preferably 25 to 50 mol %. By making the amount of the structural unit (a1) at least as large as the lower limit of the above-mentioned range, a pattern can be formed using a resist composition prepared from the copolymer (A1). On the other hand, by making the amount of the structural unit (a1) no more than the upper limit of the above-mentioned range, a good balance can be achieved with the other structural units.

Structural Unit (a2)

The copolymer (A1) has a structural unit (a2) derived from an acrylate ester having a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group, in which the only ring structure is the lactone ring, is referred to as a monocyclic group, and groups containing other ring structures are described as polycyclic groups regardless of the structure of the other rings.

When the copolymer (A1) is used for forming a resist film, the lactone-containing cyclic group of the structural unit (a2) is effective in improving the adhesion between the resist film and the substrate, and increasing the hydrophilicity to the developing solution.

As the structural unit (a2), there is no particular limitation, and an arbitrary structural unit may be used.

Specific examples of lactone-containing monocyclic groups include groups in which one hydrogen atom has been removed from γ-butyrolactone. Specific examples of lactone-containing polycyclic groups include groups in which one hydrogen atom has been removed from a lactone ring-containing bicycloalkane, tricycloalkane, or tetracycloalkane.

More specifically, examples of the structural unit (a2) include structural units represented by general formulas (a2-1) to (a2-5) shown below.

[Chemical Formula 17]

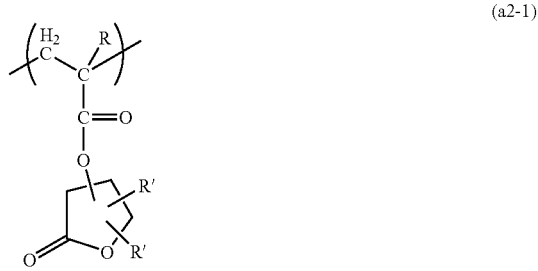

(a2-1)

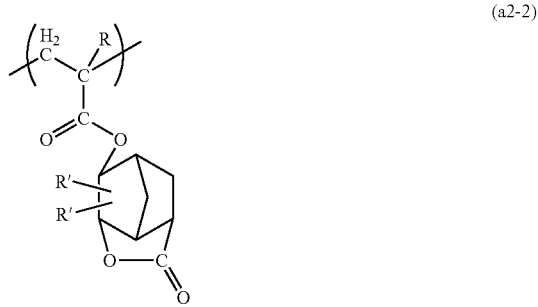

(a2-2)

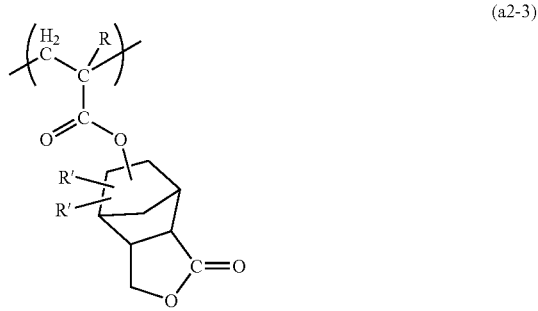

(a2-3)

-continued (a2-4)

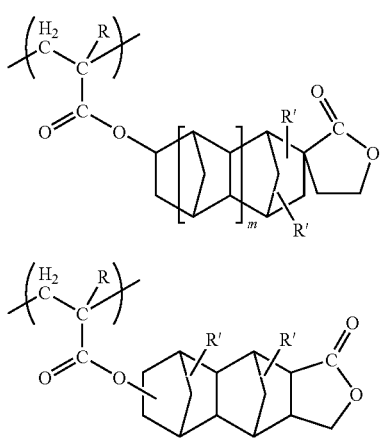

(a2-5)

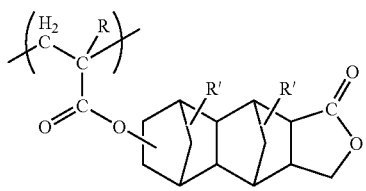

(wherein R represents a hydrogen atom, a halogen atom, a lower alkyl group or a halogenated lower alkyl group; R' represents a hydrogen atom, a lower alkyl group or an alkoxy group having 1 to 5 carbon atoms; and m represents 0 or 1.)

In general formulas (a2-1) to (a2-5), R is the same as R in the structural unit (a1).

The lower alkyl group represented by R' is the same as the lower alkyl group represented by R in the structural unit (a1).

In the structural units represented by general formulas (a2-1) to (a2-5), in consideration of industrial availability, R' preferably represents a hydrogen atom.

Specific examples of structural units represented by the aforementioned general formulas (a2-1) to (a2-5) are shown below.

[Chemical Formula 18]

(a2-1-1)

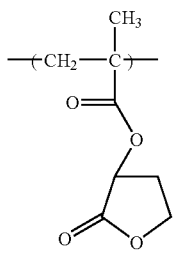

(a2-1-2)

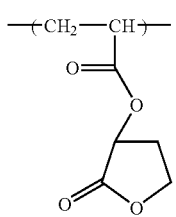

(a2-1-3)

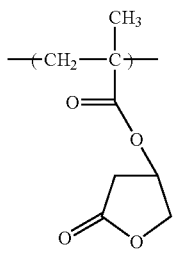

(a2-1-4)

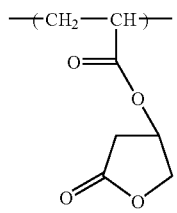

(a2-1-5)

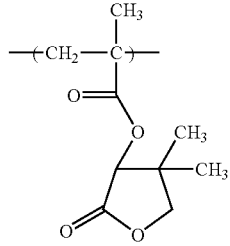

(a2-1-6)

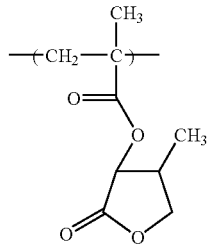

[Chemical Formula 19]

(a2-2-1)

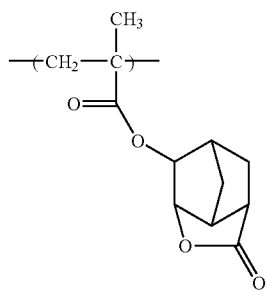

(a2-2-2)

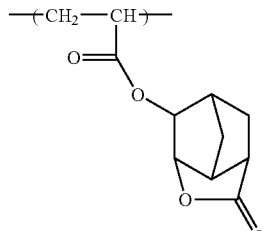

(a2-2-3)

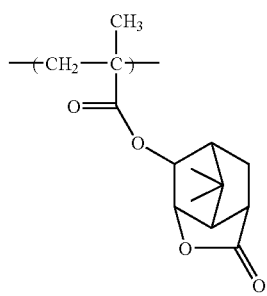

(a2-2-4)
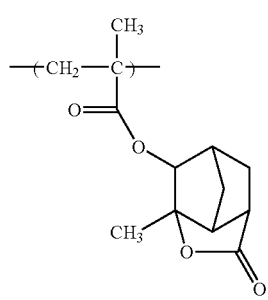
(a2-2-5)
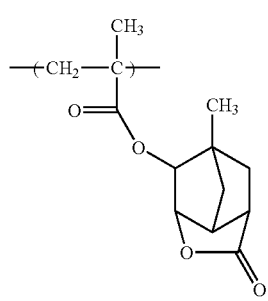
[Chemical Formula 20]
(a2-3-1)
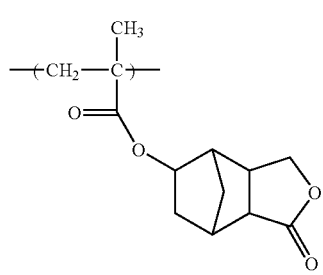
(a2-3-2)
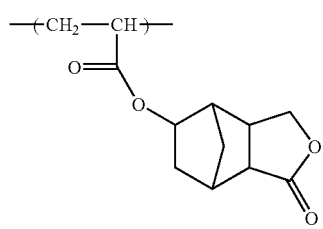
(a2-3-3)
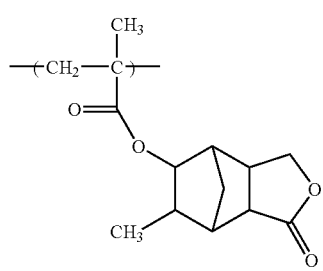
(a2-3-4)
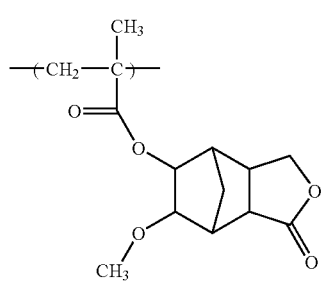
(a2-3-5)
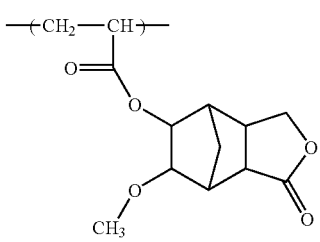
(a2-3-6)
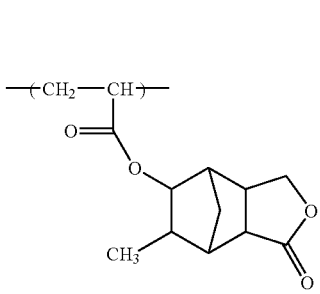
(a2-3-7)
(a2-3-8)
(a2-3-9)

(a2-3-10) 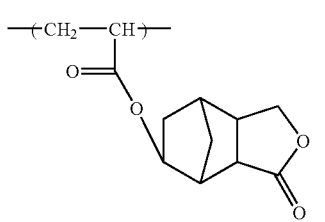
[Chemical Formula 21]
(a2-4-1) 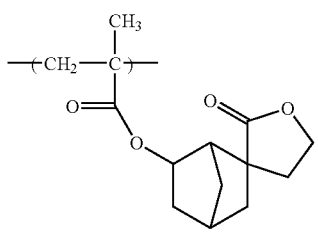
(a2-4-2) 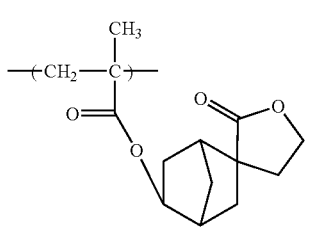
(a2-4-3) 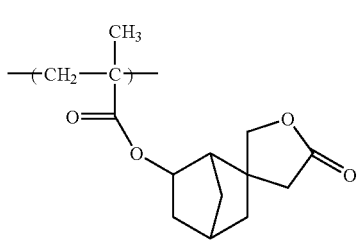
(a2-4-4) 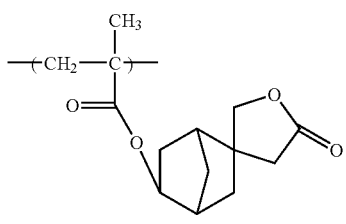
(a2-4-5) 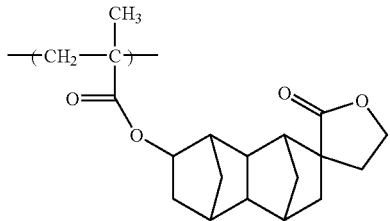
(a2-4-6) 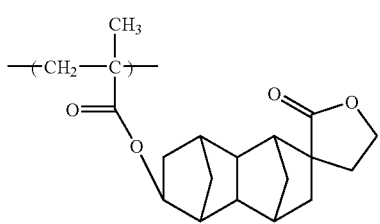
(a2-4-7) 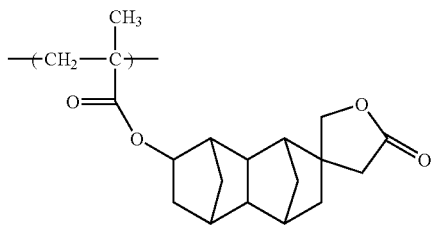
(a2-4-8) 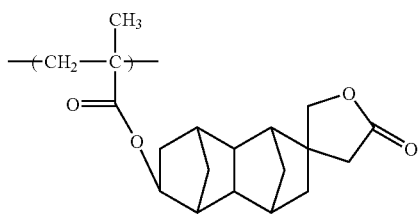
(a2-4-9) 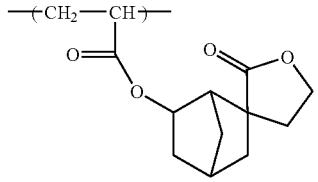
(a2-4-10) 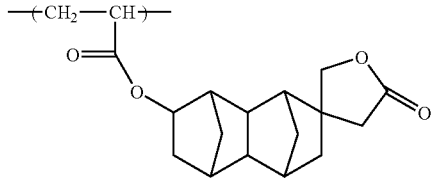
(a2-4-11) 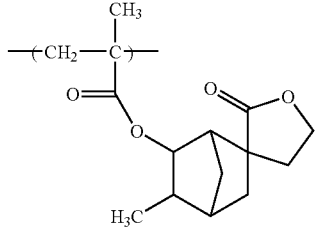
(a2-4-12) 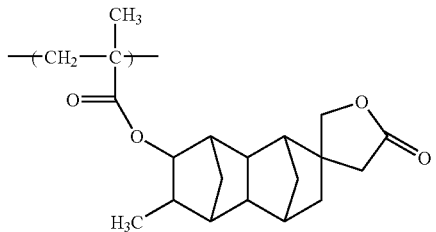
[Chemical Formula 22]
(a2-5-1) 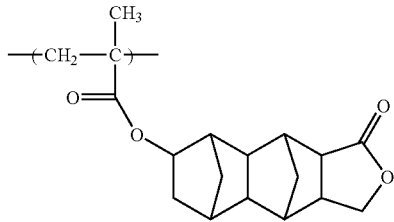

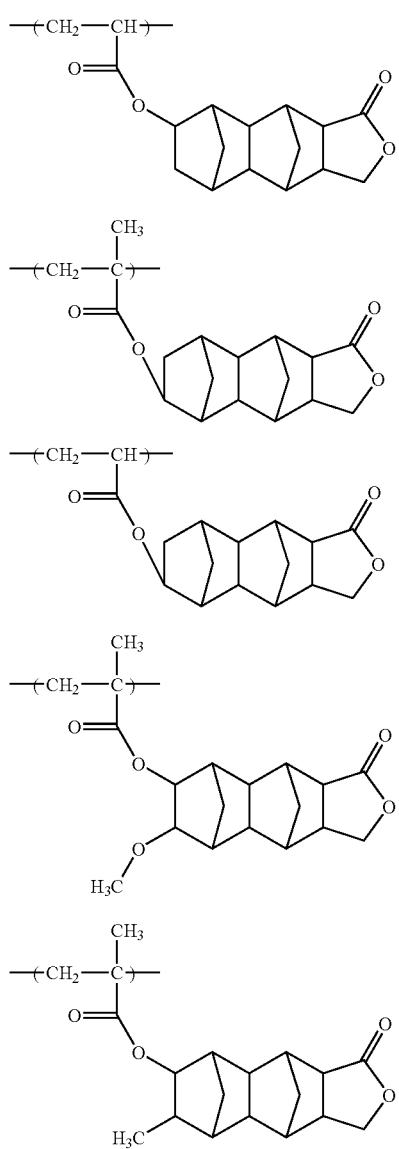

Of these, it is preferable to use at least one structural unit selected from the group consisting of formulas (a2-1) to (a2-5), and it is preferable to use at least one structural unit selected from the group consisting of formulas (a2-1) to (a2-3). Specifically, it is preferable to use at least one structural unit selected from the group consisting of chemical formulas (a2-1-1), (a2-1-2), (a2-2-1), (a2-2-2), (a2-3-1), (a2-3-2), (a2-3-9), and (a2-3-10).

In the copolymer (A1), as the structural unit (a2), one type of structural unit may be used, or two or more types may be used in combination.

In the copolymer (A1), the amount of the structural unit (a2) based on the combined total of all structural units constituting the copolymer (A1) is preferably 5 to 60 mol %, more preferably 10 to 50 mol %, and still more preferably 20 to 50 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3)

The copolymer (A1) has a structural unit (a3) derived from an acrylate ester having a polar group-containing aliphatic hydrocarbon group. By including the structural unit (a3), the hydrophilicity of the component (A) is improved, and hence, the affinity of the component (A) to the developing solution is improved. As a result, the alkali solubility of the exposed portions improves, which contributes to favorable improvements in the resolution.

Examples of the polar group include a hydroxyl group, cyano group, a carboxyl group, and a hydroxylalkyl group in which at least one hydrogen atom within an alkyl group has been substituted with a fluorine atom, and a hydroxyl group is particularly preferable.

Examples of the aliphatic hydrocarbon group include a linear or branched hydrocarbon group (preferably alkylene group) having 1 to 10 carbon atoms and a polycyclic aliphatic hydrocarbon group (polycyclic group).

The polycyclic group can be appropriately selected from the multitude of structural units proposed for resins of resist compositions for ArF excimer lasers. The polycyclic group preferably has 6 to 12 carbon atoms.

Of these, a structural unit derived from an acrylate ester having the aliphatic polycyclic group, which contains a hydroxyl group, cyano group, a carboxyl group, or a hydroxylalkyl group in which at least one hydrogen atom within an alkyl group has been substituted with a fluorine atom, is more preferable.

Examples of the polycyclic group include groups in which one or more hydrogen atoms have been removed from a bicycloalkane, tricycloalkane, or tetracycloalkane, or the like. Specific examples include groups in which one or more hydrogen atoms have been removed from a polycycloalkane such as adamantane, norbornane, isobornane, tricyclodecane, or tetracyclododecane. Of these polycyclic groups, groups, in which two or more hydrogen atoms have been removed from an adamantyl group, norbornyl group, or tetracyclododecanyl group, are industrially preferable.

As the structural unit (a3), a structural unit derived from hydroxyethyl ester of acrylic acid is preferable when the hydrocarbon group within the polar group-containing aliphatic hydrocarbon group is a linear or branched hydrocarbon group having 1 to 10 carbon atoms, and structural units represented by formulas (a3-1), (a3-2), and (a3-3) are preferable when the hydrocarbon group is a polycyclic group.

[Chemical Formula 23]

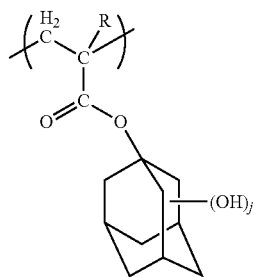

-continued

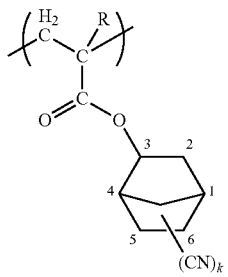 (a3-2)

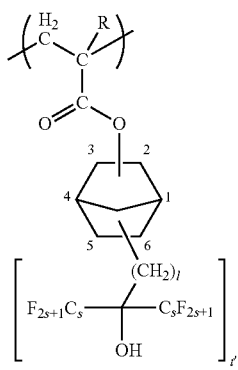 (a3-3)

(wherein R represents the same as the aforementioned; j represents an integer of 1 to 3; k represents an integer of 1 to 3; t' represents an integer of 1 to 3;l represents an integer of 1 to 5; and s represents an integer of 1 to 3.)

In formula (a3-1), j represents preferably 1 or 2,and more preferably 1. When j represents 2, it is preferable that the hydroxyl groups be bonded to the 3-position and 5-position of the adamantyl group, When j represents 1, it is preferable that the hydroxyl group be bonded to the 3-position of the adamantyl group.

j preferably represents 1, and it is particularly preferable that the hydroxyl group be bonded to the 3-position of the adamantyl group.

In formula (a3-2), k preferably represents 1. The cyano group is preferably bonded to the 5-position or 6-position of the norbornyl group.

In formula (a3-3), t' preferably represents 1, 1 preferably represents 1, and s preferably represents 1. In formula (a3-3), it is preferable that a 2-norbonyl group or 3-norbonyl group be bonded to the terminal of the carboxyl group of the acrylic acid.

The fluorinated alkyl alcohol is preferably bonded to the 5-position or 6-position of the norbornyl group.

As the structural unit (a3), one type of structural unit may be used, or two or more types may be used in combination.

In the copolymer (A1), the amount of structural unit (a3) based on the combined total of all structural units constituting the copolymer (A1) is preferably 5 to 50 mol %, more preferably 5 to 40 mol %, and most preferably 5 to 25 mol %.

Structural Unit (a4)

The copolymer (A1) may further contain a structural unit (a4) which is other than the above-mentioned structural units (a1) to (a3), as long as the effects of the present invention are not impaired.

As the structural unit (a4), any other structural unit which cannot be classified as one of the above structural units (a1) to (a3) can be used without any particular restrictions, and any of the multitude of conventional structural units used within resist resins for ArF excimer lasers or KrF excimer lasers (and particularly for ArF excimer lasers) can be used.

As the structural unit (a4), for example, a structural unit, which is derived from an acrylate ester containing a non-acid-dissociable aliphatic polycyclic group, is preferable. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In terms of industrial availability and the like, at least one polycyclic group selected from amongst a tricyclodecanyl group, adamantyl group, tetracyclododecanyl group, isobornyl group, and norbornyl group is particularly preferable. These polycyclic groups may have the hydrogen atoms substituted with linear or branched alkyl groups having 1 to 5 carbon atoms.

Specific examples of the structural unit (a4) include structural units with structures represented by general formulas (a4-1) to (a4-5) shown below.

[Chemical Formula 24]

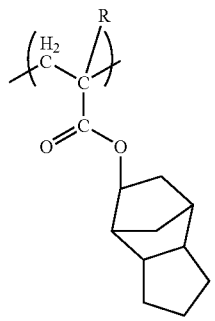 (a4-1)

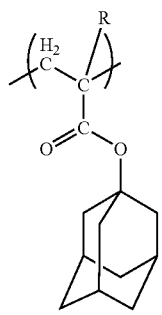 (a4-2)

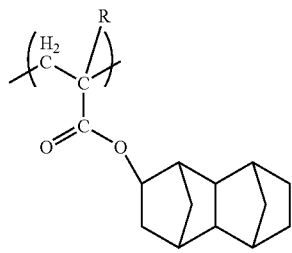 (a4-3)

-continued

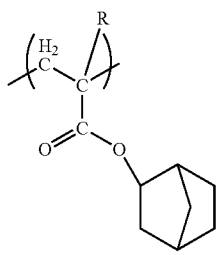
(a4-4)

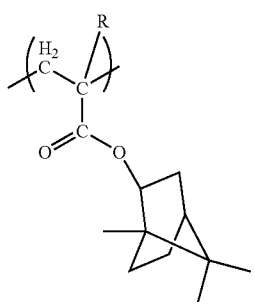
(a4-5)

(wherein R represents the same as the aforementioned.)

When the structural unit (a4) is contained in the copolymer (A1), the amount of the structural unit (a4) based on the combined total of all structural units constituting the copolymer (A1) is preferably 1 to 30 mol %, and preferably 10 to 20 mol %.

In the present invention, the copolymer (A1) includes the structural units (a1), (a2), and (a3), and examples thereof include a copolymer consisting of the structural units (a1), (a2), and (a3), and a copolymer consisting of the structural units (a1), (a2), (a3), and (a4).

In the present invention, as the copolymer (A1), the copolymer containing the combination of the structural units shown below is particularly preferable.

[Chemical Formula 25]

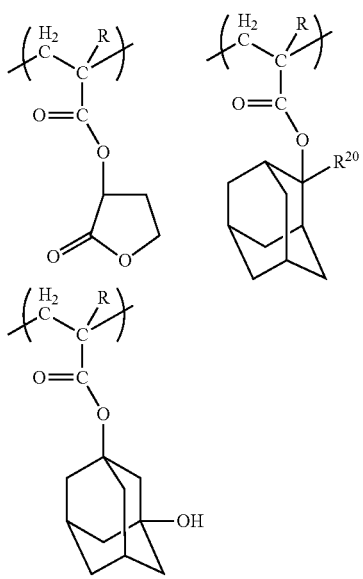
(A1-21)

(wherein R represents the same as the aforementioned, and $R^{20}$ represents a lower alkyl group.)

In formula (A1-21), the lower alkyl group represented by $R^{20}$ is the same as the lower alkyl group represented by R, and a methyl group or an ethyl group is preferable, and a methyl group is most preferable.

The copolymer (A1) can be obtained, for example, by a conventional radical polymerization or the like of the monomers corresponding with each of the structural units, using a radical polymerization initiator such as azobisisobutyronitrile (AIBN).

Furthermore, in the copolymer (A1), by simultaneously using a chain transfer agent such as HS—$CH_2$—$CH_2$—$CH_2$—$C(CF_3)_2$—OH, a —$C(CF_3)_2$—OH group can be introduced at the terminals of the copolymer (A1). Such a copolymer having introduced a hydroxyalkyl group in which at least one of the hydrogen atoms of the alkyl group are substituted with fluorine atoms is effective in decreasing developing defects and LER (line edge roughness: unevenness of the side walls of a line pattern).

The weight average molecular weight (Mw) (the polystyrene equivalent value determined by gel permeation chromatography (GPC)) of the copolymer (A1) is not particularly limited, but is preferably 2,000 to 50,000, more preferably 3,000 to 30,000, and most preferably 5,000 to 20,000. By making the weight average molecular weight no more than the upper limit of the above-mentioned range, the copolymer (A1) exhibits satisfactory solubility in a resist solvent. On the other hand, by making the weight average molecular weight at least as large as the lower limit of the above-mentioned range, dry etching resistance and cross-sectional shape of the resist pattern becomes satisfactory.

Further, the polydispersity (Mw/Mn) is preferably 1.0 to 5.0, more preferably 1.0 to 3.0, and most preferably 1.2 to 2.5. Herein, Mn represents a number average molecular weight.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

Examples of onium salt-based acid generators include acid generators represented by general formula (b-0) shown below.

[Chemical Formula 26]

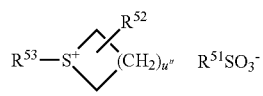
(b-0)

(wherein $R^{51}$ represents a linear, branched, or cyclic alkyl group, or a linear, branched, or cyclic fluorinated alkyl group; $R^{52}$ represents a hydrogen atom, a hydroxyl group, a halogen atom, a linear, branched, or cyclic alkyl group, a linear or branched halogenated alkyl group, or a linear or branched alkoxy group; $R^{53}$ represents an aryl group which may include a substituent group; and u" represents an integer from 1 to 3).

In general formula (B1), $R^{51}$ represents a linear, branched, or cyclic alkyl group, or a linear, branched, or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The linear, branched, or cyclic fluorinated alkyl group preferably has the same carbon number as the aforementioned linear, branched, or cyclic fluorinated alkyl group. The fluorination ratio of the fluorinated alkyl group (the proportion of fluorine atoms, with which hydrogen atoms are substituted, relative to the total number of hydrogen atoms in the alkyl group) is preferably from 10 to 100%, more preferably from 50 to 100%, and groups in which all of the hydrogen atoms have been substituted with fluorine atoms yield the strongest acids, and are consequently the most preferred.

$R^{51}$ is most preferably a linear alkyl group or fluorinated alkyl group.

$R^{52}$ is a hydrogen atom, a hydroxyl group, a halogen atom, a linear, branched, or cyclic alkyl group, a linear or branched halogenated alkyl group, or a linear or branched alkoxy group.

In $R^{52}$, examples of the halogen atom include a fluorine atom, a bromine atom, a chlorine atom, and an iodine atom, of which a fluorine atom is preferable.

In $R^{52}$, the alkyl group is linear or branched, and preferably has 1 to 5 carbon atoms, particularly 1 to 4 carbon atoms, and more preferably 1 to 3 carbon atoms.

In $R^{52}$, the halogenated alkyl group is a group in which at least one or all of the hydrogen atoms in the alkyl group are substituted with a halogen atom. Herein, as the alkyl group, the same groups as "alkyl group" represented by $R^{52}$ are exemplified. As the halogen atom to be substituted, the same atoms as those described for the above "halogen atom" are exemplified. In the halogenated alkyl group, 50 to 100% of all the hydrogen atoms are preferably substituted with the halogen atom and, more preferably, all the hydrogen atoms are substituted.

In $R^{52}$, the alkoxy group is linear or branched, and preferably has 1 to 5 carbon atoms, particularly 1 to 4 carbon atoms, and more preferably 1 to 3 carbon atoms.

$R^{52}$ is preferably a hydrogen atom.

$R^{53}$ represents an aryl group which may include a substituent group, and examples of a basic ring (host ring) structure, in which the substituent group has been removed from the aryl group, include a naphthyl group, a phenyl group, and an anthracenyl group. In view of the effects of the present invention and absorption of exposure light such as ArF excimer lasers, a phenyl group is preferable.

Examples of the substituent group include a hydroxyl group and a lower alkyl group (which is linear or branched, and preferably has 1 or more and 5 or less carbon atoms, and is particularly preferably a methyl group).

The aryl group represented by $R^{53}$ preferably includes no substituent group.

u" represents an integer from 1 to 3, preferably 2 or 3, and particularly preferably 3.

Preferred examples of the acid generator represented by the general formula (b-0) include the following.

[Chemical Formula 27]

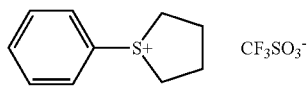

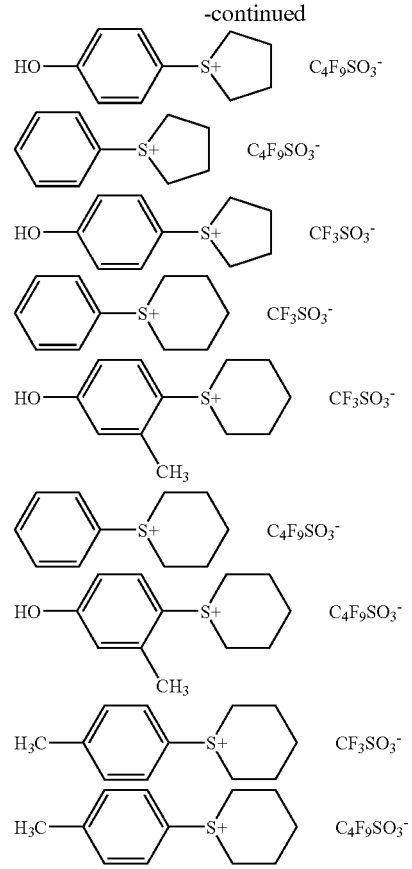

The acid generator represented by the general formula (b-0) can be used either alone, or in combinations of two or more different compounds.

Furthermore, preferable examples of onium salt-based acid generators, which is other than the acid generators represented by the general formula (b-0), include compounds represented by general formula (b-1) or (b-2) shown below.

[Chemical Formula 28]

(wherein $R^{1\prime\prime}$ to $R^{3\prime\prime}$, $R^{5\prime\prime}$ and $R^{6\prime\prime}$ each independently represents an aryl group or alkyl group; and $R^{4\prime\prime}$ represents a linear, branched, or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. Among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly preferable that all of $R^{1\prime\prime}$ to $R^{3\prime\prime}$ be aryl groups.

The aryl group for $R^{1\prime\prime}$ to $R^{3\prime\prime}$ is not specifically limited. For example, an aryl group having 6 to 20 carbon atoms may be used in which at least one or all of the hydrogen atoms of the aryl group may or may not be substituted with alkyl groups, alkoxy groups, or halogen atoms. The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group represented by $R^{1\prime\prime}$ to $R^{3\prime\prime}$ is not specifically limited, and includes, for example, a linear, branched, or cyclic alkyl group. In terms of achieving excellent resolution, the linear or branched alkyl group preferably has 1 to 10 carbon atoms, and more preferably 1 to 5 carbon atoms. The cyclic alkyl group preferably has 4 to 15 carbon atoms, more preferably 4 to 10 carbon atoms, and most preferably 6 to 10 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and preferable examples thereof include a methyl group because it is excellent in resolution and can be synthesized at a low cost.

It is most preferable that all of $R^{1\prime\prime}$ to $R^{3\prime\prime}$ are phenyl groups.

$R^{4\prime\prime}$ represents a linear, branched, or cyclic alkyl or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group (ratio of fluorine atoms within the alkyl group) is preferably from 10 to 100%, more preferably from 50 to 100%, and it is particularly preferable that all hydrogen atoms are substituted with fluorine atoms because the acid strength increases.

$R^{4\prime\prime}$ most preferably represents a linear or cyclic alkyl group or fluorinated alkyl group.

In formula (b-2), $R^{5\prime\prime}$ and $R^{6\prime\prime}$ each independently represents an aryl group or alkyl group. At least one of $R^{5\prime\prime}$ and $R^{6\prime\prime}$ represents an aryl group. It is preferable that both of $R^{5\prime\prime}$ and $R^{6\prime\prime}$ represents an aryl group.

As the aryl group represented by $R^{5\prime\prime}$ and $R^{6\prime\prime}$, the same groups as the aryl groups represented by $R^{1\prime\prime}$ to $R^{3\prime\prime}$ are exemplified.

As the alkyl group represented by $R^{5\prime\prime}$ and $R^{6\prime\prime}$, the same groups as the alkyl groups represented by $R^{1\prime\prime}$ to $R^{3\prime\prime}$ are exemplified.

It is particularly preferable that both of $R^{5\prime\prime}$ and $R^{6\prime\prime}$ represent a phenyl group.

As $R^{4\prime\prime}$ in formula (b-2), the same groups as those mentioned above for $R^{4\prime\prime}$ in formula (b-1) are exemplified.

Specific examples of onium salt-based acid generators represented by formula (b-1) and (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, and diphenyl(1-(4-methoxy)naphthyl)sulfonium trifluoromethanesulfonate, heptafluoropropanesulfonate or nonafluorobutanesulfonate. It is also possible to use onium salts in which the anion moiety of these onium salts are replaced with methanesulfonate, n-propanesulfonate, n-butanesulfonate, or n-octanesulfonate.

Further, acid generators in which the anion moiety in general formula (b-1) or (b-2) is replaced with an anion moiety represented by general formula (b-3) or (b-4) shown below (the cation moiety is the same as (b-1) or (b-2)) may be used.

[Chemical Formula 29]

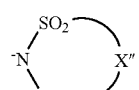

(b-3)

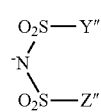

(b-4)

(wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.)

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group represented by X" or those of the alkyl group of Y" and Z" within the range of the number of carbon atoms, the more the solubility in a resist solvent becomes better.

Further, in the alkylene group of X" or the alkyl group of Y" and Z", it is preferable that the number of hydrogen atoms substituted with a fluorine atom be as large as possible, as the acid strength increases, and the transparency to high energy radiation of 200 nm or less or electron beam is improved. The ratio of fluorine atoms in the alkylene group or alkyl group, i.e. fluorination ratio, is preferably 70 to 100%, and more preferably 90 to 100%, and a perfluoroalkylene or perfluoroalkyl group, in which all hydrogen atoms are substituted with fluorine atoms, is most preferable.

In the present description, an oxime sulfonate-based acid generator is a compound having at least one group represented by general formula (B-1) shown below, and has a feature of generating acid by irradiation of radiation. Such oxime sulfonate-based acid generators are widely used for a chemically amplified resist composition, and can be appropriately selected.

[Chemical Formula 30]

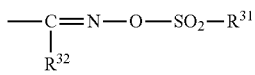
(B-1)

(wherein $R^{31}$ and $R^{32}$ each independently represents an organic group.)

The organic group represented by $R^{31}$ and $R^{32}$ is a group containing a carbon atom, and may include atoms other than carbon atoms (e.g., a hydrogen atom, an oxygen atom, a nitrogen atom, a sulfur atom, a halogen atom (such as a fluorine atom or a chlorine atom) and the like).

As the organic group represented by $R^{31}$, a linear, branched, or cyclic alkyl group or aryl group is preferable. The alkyl group or the aryl group may have a substituent group. The substituent group is not particularly limited, and examples thereof include a fluorine atom and a linear, branched, or cyclic alkyl group having 1 to 6 carbon atoms. The expression "having a substituent group" means that at least one or all of the hydrogen atoms of the alkyl group or the aryl group are replaced with substituent groups.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. As the alkyl group, partially or completely halogenated alkyl group (hereinafter, sometimes referred to as a "halogenated alkyl group") is particularly preferable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and the fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted by halogen atoms.

As $R^{31}$, an alkyl group of 1 to 4 carbon atoms which has no substituent or a fluorinated alkyl group of 1 to 4 carbon atoms is particularly preferable.

As the organic group for $R^{32}$, a linear, branched, or cyclic alkyl group, an aryl group, or a cyano group is preferable. Examples of the alkyl group and the aryl group represented by $R^{32}$ are the same as the alkyl group and the aryl group represented by $R^{31}$.

As $R^{32}$, a cyano group, an alkyl group having 1 to 8 carbon atoms and no substituent group, or a fluorinated alkyl group having 1 to 8 carbon atoms is particularly preferable.

Preferred examples of the oxime sulfonate-based acid generator include compounds represented by general formula (B-2) or (B-3) shown below.

[Chemical Formula 31]

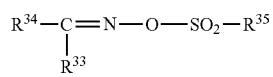
(B-2)

(wherein $R^{33}$ represents a cyano group, an alkyl group having no substituent group, or a halogenated alkyl group; $R^{34}$ represents an aryl group; and $R^{35}$ represents an alkyl group having no substituent group or a halogenated alkyl group.)

[Chemical Formula 32]

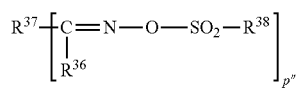
(B-3)

(wherein $R^{36}$ represents a cyano group, an alkyl group having no substituent group, or a halogenated alkyl group; $R^{37}$ represents a divalent or trivalent aromatic hydrocarbon group; $R^{38}$ represents an alkyl group having no substituent group, or a halogenated alkyl group; and p" represents 2 or 3.)

In general formula (B-2), the alkyl group having no substituent group or the halogenated alkyl group represented by $R^{33}$ preferably has 1 to 10 carbon atoms, more preferably 1 to 8 carbon atoms, and most preferably 1 to 6 carbon atoms.

As for the $R^{33}$, a halogenated alkyl group is preferable, and a fluorinated alkyl group is more preferable.

The fluorinated alkyl group represented by $R^{33}$ preferably has 50% or more of the hydrogen atoms thereof fluorinated, more preferably 70% or more, and still more preferably 90% or more.

Examples of the aryl group represented by $R^{34}$ include groups in which one hydrogen atom has been removed from an aromatic hydrocarbon ring, such as a phenyl group, a biphenyl group, a fluorenyl group, a naphthyl group, an anthracyl group, and a phenantryl group, and heteroaryl groups in which at least one of the carbon atoms constituting the ring(s) of these groups are substituted with heteroatoms such as an oxygen atom, a sulfur atom, and a nitrogen atom. Of these, a fluorenyl group is preferable.

The aryl group represented by $R^{34}$ may have a substituent group such as an alkyl group having 1 to 10 carbon atoms, a halogenated alkyl group, and an alkoxy group. The alkyl group and the halogenated alkyl group serving as the substituent group preferably have 1 to 8 carbon atoms, and more preferably 1 to 4 carbon atoms. The halogenated alkyl group thereof is preferably a fluorinated alkyl group.

The alkyl group having no substituent group or the halogenated alkyl group represented by $R^{35}$ preferably have 1 to 10 carbon atoms, more preferably 1 to 8 carbon atoms, and most preferably 1 to 6 carbon atoms.

As $R^{35}$, a halogenated alkyl group is preferable, a fluorinated alkyl group is preferable, and a partially fluorinated alkyl group is most preferable.

In terms of enhancing the strength of the acid generated, the fluorinated alkyl group represented by $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is most preferable.

In general formula (B-3), the alkyl group having no substituent group and the halogenated alkyl group represented by $R^{36}$ are the same as the alkyl group having no substituent group and the halogenated alkyl group represented by $R^{33}$.

Examples of the divalent or trivalent aromatic hydrocarbon group represented by $R^{37}$ include groups in which one or two hydrogen atoms have been removed from the aryl group represented by $R^{34}$.

As the alkyl group having no substituent group or the halogenated alkyl group represented by $R^{38}$, the same one as the alkyl group having no substituent group or the halogenated alkyl group represented by $R^{35}$ are exemplified.

p" is preferably 2.

Specific examples of oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

In addition, the oxime sulfonate-based acid generators disclosed in Japanese Unexamined Patent Application, First Publication No. Hei 9-208554 ([Chemical Formula 18] and [Chemical Formula 19] in paragraphs [0012] to [0014]) and the oxime sulfonate-based acid generators disclosed in International Publication WO2004/074242A2 (Example 1 to Example 40 on pages 65 to 85) can be used preferably.

Further, preferable examples thereof include compounds represented by chemical formulas shown below.

[Chemical Formula 33]

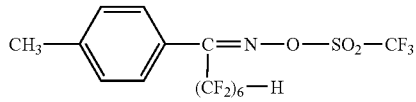
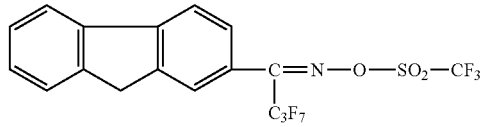
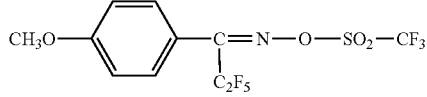
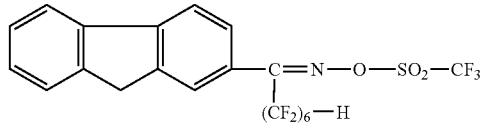
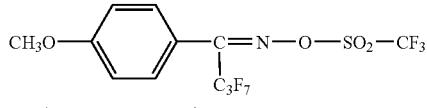
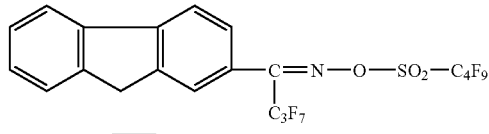
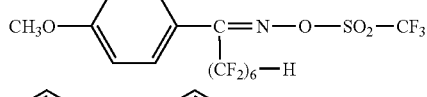
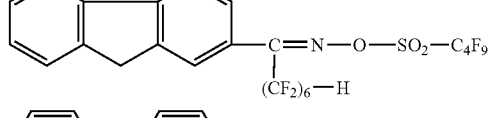
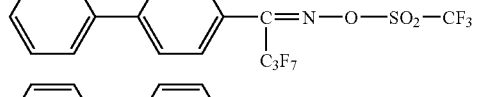
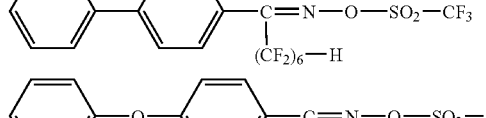
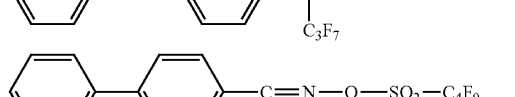
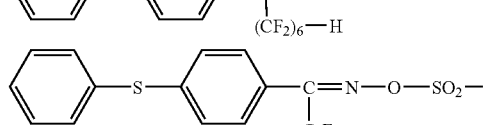

-continued

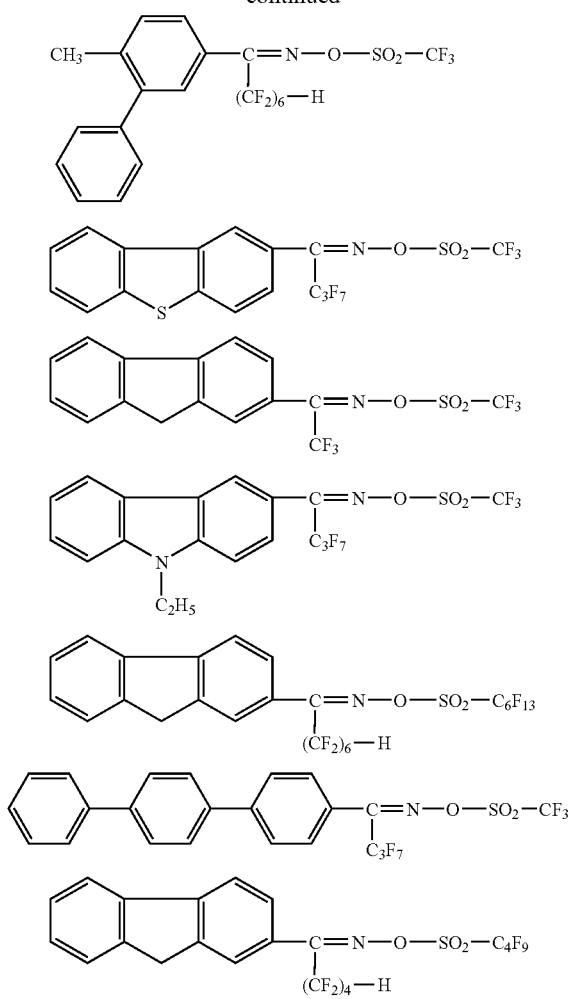

[Chemical Formula 34]

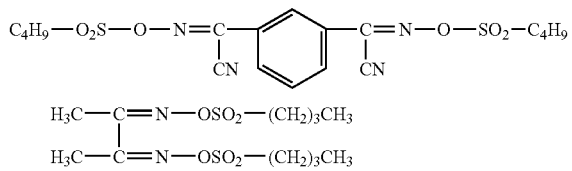

Among the above-exemplified compounds, the following 4 compounds are preferable.

[Chemical Formula 35]

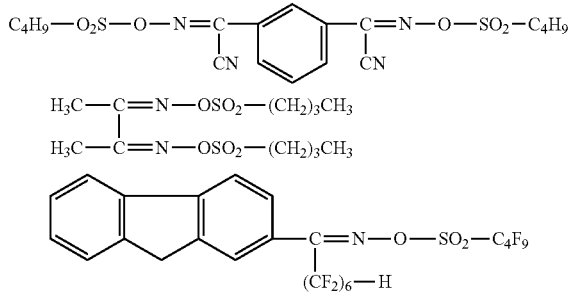

-continued

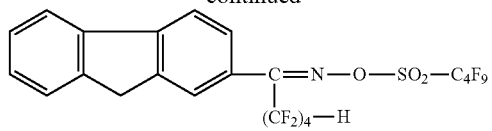

Of the aforementioned diazomethane-based acid generators, specific examples of bisalkyl or bisaryl sulfonyl diazomethanes include bis(isopropylsulfonyl)diazomethane, bis (p-toluenesulfonyl)diazomethane, bis(1,1-dimethylethylsulfonyl)diazomethane, bis (cyclohexylsulfonyl)diazomethane, and bis(2,4-dimethylphenylsulfonyl)diazomethane.

In addition, the diazomethane-based acid generators disclosed in Japanese Unexamined Patent Applications, First Publications No. Hei 11-035551, Hei 11-035552, and Hei 11-035573 can be used preferably.

Furthermore, specific examples of poly(bis-sulfonyl)diazomethanes include those disclosed in Japanese Unexamined Patent Application, First Publication No. Hei 11-322707; such as 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis (cyclohexylsulfonyldiazomethylsulfonyl)hexane, and 1,10-bis(cyclohexylsulfonyldiazomethylsulfonyl)decane.

As the component (B), the aforementioned acid generators may be used alone or in combinations of two or more.

In the present invention, as the component (B), an onium salt having a fluorinated alkylsulfonate ion as the anion moiety is preferably used. For example, (4-methylphenyl)diphenylsulfonium nonafluorobutane sulfonate is preferably used.

In a resist composition of the present invention, the amount of the component (B) is 0.5 to 30 parts by mass, and preferably 1 to 10 parts by mass, relative to 100 parts by mass of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (S)>

The resist composition of the present invention is prepared by dissolving the materials for the resist composition in an organic solvent (S) (hereafter referred to as component (S)).

The component (S) includes an aromatic organic solvent (S1) (hereafter referred to as component (S1)). It is speculated that the reduction effect of the level of LWR can be obtained by including the component (S1).

The component (S1) is a compound containing an aromatic ring and having capability of homogeneously dissolving each of the components used for the resist composition.

In the present invention, since the solubility for the component (A) or the like is favorable, an ether bond-containing aromatic organic solvent (S1-1). Specific examples thereof include anisole, ethyl benzyl ether, cresyl methyl ether, diphenyl ether, dibenzyl ether, phenetole, and butyl phenyl ether. Of these, anisole is most preferable.

In addition, an ether bond-free aromatic organic solvent (S1-2) can be preferably used to improve the reduction effect of the level of LWR. Specific examples thereof include ethylbenzene, diethylbenzene, amylbenzene, isopropylbenzene, toluene, xylene, cymene, and mesitylene. Of these, xylene is most preferable.

In these components (S1), the component (S1-1) or the component (S1-2) may be used alone or in combinations of two or more. Also, the combination of the component (S1-1) and the component (S1-2) may be used.

The amount of the component (S1) in the organic solvent (S) is preferably 10 mass % ore more, more preferably 20 mass % or more, and most preferably 30 mass % or more.

By making the amount of the component (S1) at least as large as the lower limit of the above-mentioned range, the reduction effect of the level of LWR is improved.

The amount of the component (S1) may be 100 mass %. The component (S1) can be used in combination with other solvent for the purpose of adjusting the solubility for the component (A) or the like and other properties. In this case, the upper limit of the amount of the component (S1) is substantially 50 mass % or less.

In the present invention, as the component (S1), an organic solvent (S2) other than the component (S1) (hereafter referred to as component (S2)) is preferably used together with the component (S1). As previously described, the solubility for the component (A) or the like and other properties can be adjusted by simultaneously using the component (S2).

As the component (S2), one, or two or more of organic solvents can be appropriately selected and used from those which have been conventionally known as solvents for a chemically amplified resist.

Examples thereof include lactones such as γ-butyrolactone; ketones such as acetone, methyl ethyl ketone, cyclohexanone, methyl-n-amyl ketone, methyl isoamyl ketone, or 2-heptanone; polyhydric alcohols and derivatives thereof, such as ethylene glycol, diethylene glycol, propylene glycol, and dipropylene glycol; an ester bond-containing compounds such as ethylene glycol monoacetate, diethylene glycol monoacetate, propylene glycol monoacetate, or dipropylene glycol monoacetate; polyhydric alcohol derivatives such as ether-containing compounds such as monophenyl ether or monoalkyl ether such as monomethyl ether, monoethyl ether, monopropyl ether, or monobutyl ether of any of the aforementioned polyhydric alcohols or the aforementioned ester bond-containing compounds; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

Of these, a propylene glycol monoalkyl ether acetate and γ-butyrolactone are preferable. As a propylene glycol monoalkyl ether acetate, propylene glycol monomethyl ether acetate (PGMEA) is preferable.

The mixing ratio of the component (S1) and the component (S2) is, at a mass ratio, preferably from 1:9 to 9:1, more preferably from 2:8 to 8:2, and most preferably from 2:8 to 5:5. When the mixing ratio is at least as large as the lower limit of the above-mentioned range, the reduction effect of the level of LWR is improved. On the other hand, when the mixing ratio is no more than the upper limit of the above-mentioned range, the solubility for the component (A) or the like is improved.

As a combination of organic solvents, a mixed solvent of at least one of anisole and xylene with PGMEA is preferable. In this case, the mixing ratio thereof is preferably from 1:9 to 9:1, more preferably from 2:8 to 8:2, and most preferably from 2:8 to 5:5.

Also, as organic solvents, a mixed solvent of a mixed solvent of at least one of anisole and xylene with PGMEA, with γ-butyrolactone is more preferable. In this case, the mixing ratio (former:latter) thereof is preferably from 50:50 to 99.5:0.5, more preferably from 65:35 to 99.5:0.5, particularly preferably from 75:25 to 99.5:0.5, and most preferably from 90:10 to 99:1.

The amount of the component (S) is not particularly limited, and is appropriately adjusted to a concentration which enables coating of a coating solution to a substrate, depending on the thickness of the coating film. In general, the component (S) is used in an amount such that the solid content of the resist composition becomes within the range from 2 to 20% by weight, and preferably from 5 to 15% by weight.

<Component (D)>

In the positive resist composition of the present invention, for improving the resist pattern shape and the post exposure stability of the latent image formed by the pattern-wise exposure of the resist layer, it is preferable to add a nitrogen-containing organic compound (D) (hereafter referred to as component (D)) as an optional component.

A multitude of these components (D) have already been proposed, and any of these known compounds may be used, although an aliphatic amine, and particularly a secondary aliphatic amine or tertiary aliphatic amine is preferable.

Examples of these aliphatic amines include amines in which at least one hydrogen atom of ammonia ($NH_3$) has been substituted with an alkyl group or hydroxyalkyl group of at least 1 and no more than 12 carbon atoms (i.e., alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Of these, alkyl alcohol amines and trialkyl amines are preferable, and alkyl alcohol amines are most preferable. Among alkyl alcohol amines, triethanolamine and triisopropanolamine are most preferable.

The component (D) is typically used in an amount within a range from 0.01 to 5.0 parts by mass, relative to 100 parts by mass of the component (A).

<Optional Components>

In a resist composition of the present invention, for preventing any deterioration in sensitivity and improving the resist pattern shape and the post exposure stability of the latent image formed by the pattern-wise exposure of the resist layer, an organic carboxylic acid, or a phosphorus oxo acid or derivative thereof (E) (hereafter referred to as component (E)) can also be added as another optional component.

Examples of organic carboxylic acids include malonic acid, citric acid, malic acid, succinic acid, benzoic acid, and salicylic acid. Of these, salicylic acid is preferable.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid. Of these, phosphonic acid is particularly preferable.

The component (E) is typically used in an amount within a range from 0.01 to 5.0 parts by mass, relative to 100 parts by mass of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

A resist composition of the present invention has an effect in that a resist pattern, in which the level of LWR is reduced, can be provided. The reason thereof is not clarified, but the following reason is speculated.

The aromatic organic solvent (S1) includes an aromatic ring. In the present invention, it is believed that this aromatic ring has a supplementary effect or something like that in the case of the deprotection of acid-dissociable dissolution-inhibiting groups (protecting group) within the component (A) upon exposure, thereby reducing the level of LWR of a resist pattern.

In particular, an aromatic organic solvent containing an ether bond-containing component has a favorable solubility for the component (A) or the like. Therefore, the use of a resist composition, which includes an aromatic organic solvent containing an ether bond-containing component, reduces the defect risk of a resist pattern. In addition, the aforementioned solvent can be used in the same manner as solvents added for improving the solubility for the component (A) or the like, such as ethyl lactate which is conventionally used. Herein, the term "defect risk" refers to the possibility of the occurrence of scum or defects of a resist pattern which are detected when a resist pattern after development is observed from directly above by using the surface defect observation apparatus manufactured by KLA-Tencor Corporation (trade name: "KLA"), for example.

Also, in a resist composition of the present invention, a favorable resist pattern shape can be obtained.

Furthermore, a resist composition of the present invention has favorable mask linearity which indicates how truly a mask size can be reproduced in a resist pattern when a mask size is changed, and favorable exposure margin which indicates a margin in which the size of a resist pattern is not changed when exposure amount is changed.

<Method of Forming a Resist Pattern>

A method of forming a resist pattern according to the present invention can be performed, for example, as follows.

Firstly, a resist composition according to the present invention is applied onto a substrate such as a silicon wafer using a spinner or the like, and a prebake (PAB) is conducted under temperature conditions of 80 to 150° C. for 40 to 120 seconds, and preferably 60 to 90 seconds to form a resist film.

Then, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, and preferably 60 to 90 seconds.

Subsequently, developing is conducted using an alkali developing solution such as a 0.1 to 10 mass % aqueous solution of tetramethylammonium hydroxide.

In this manner, a resist pattern that is true to the mask pattern can be obtained.

An organic or inorganic anti-reflective film may also be provided between the substrate and the applied layer of the resist composition.

The wavelength to be used for exposure is not particularly limited and the exposure can be conducted using radiations such as ArF excimer lasers, KrF excimer lasers, $F_2$ excimer lasers, extreme ultraviolet rays (EUV), vacuum ultraviolet rays (VUV), electron beams (EB), X-rays, and soft X-rays. A resist composition of the present invention is particularly effective to ArF excimer lasers.

EXAMPLES

Hereafter, the present invention is further described with reference to examples although the present invention is by no way limited by these examples.

Examples 1 and 2 and Comparative Example 1

The components shown in Table 1 were mixed together and dissolved to obtain a positive resist composition solution.

TABLE 1

| | (A) | (B) | (D) | (S) | | |
|---|---|---|---|---|---|---|
| Example 1 | (A)-1 | (B)-1 | (D)-1 | ANS | PGMEA | GBL |
| | [100] | [2.5] | [0.25] | [500] | [750] | [25] |
| Example 2 | (A)-1 | (B)-1 | (D)-1 | XL | PGMEA | GBL |
| | [100] | [2.5] | [0.25] | [500] | [750] | [25] |
| Comparative Example 1 | (A)-1 | (B)-1 | (D)-1 | EL | PGMEA | GBL |
| | [100] | [2.5] | [0.25] | [500] | [750] | [25] |

In Table 1, each of the abbreviations means the following. Also, the values in brackets [ ] indicate the amount (in terms of parts by mass) of the component added.

(A)-1: the copolymer represented by the formula (A)-1 shown below $l:m:n=4:4:2$ (molar ratio), $Mw=10000$, $Mw/Mn=2.0$ (B)-1: (4-methylphenyl)diphenylsulfonium nonafluorobutane sulfonate (D)-1: triethanolamine ANS: anisole XL: xylene PGMEA: propylene glycol monomethyl ether acetate GBL: γ-butyrolactone EL: ethyl lactate

[Chemical Formula 36]

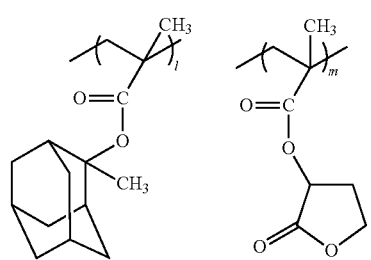

(A)-1

-continued

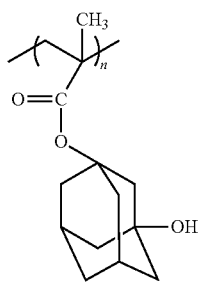

[Evaluation of LWR]

An organic antireflection film composition (manufactured by Brewer Science Ltd.; trade name: ARC-29) was applied onto an 8 inch silicon wafer. Then, the silicon wafer was sintered at 225° C. for 60 seconds, thereby forming an antireflection film having a thickness of 77 nm as a substrate.

The obtained positive resist composition solution was uniformly applied onto the substrate using a spinner, and then dried by prebaking on a hot plate at 130° C. (post applied bake (PAB) temperature) for 60 seconds, thus forming a resist layer with a film thickness of 250 nm.

Subsequently, the obtained resist layer was selectively exposed by using an ArF exposure apparatus (wavelength: 193 nm) NSR-S302A (manufactured by Nikon; numerical aperture (NA)=0.60, 2/3 annual illumination) through a half tone mask. Thereafter, a PEB treatment was conducted at 130° C. for 60 seconds, followed by development for 30 seconds at 23° C. in a developing solution (2.38 mass % aqueous solution of tetramethylammonium hydroxide), rinsing with pure water for 30 seconds, and drying, thereby forming a resist pattern with a line and space (1:1) of 120 nm.

Then, the line widths were measured at 5 positions along the longer direction of the line using a measuring SEM (manufactured by Hitachi, Ltd.; trade name: "S-9220"), and the threefold value (3s) of the standard deviation (s) was calculated from the obtained results as a measure of indicating LWR.

As the value of 3s becomes smaller, the roughness of line widths becomes smaller, thus meaning that a resist pattern having a uniform width is obtained. The results are shown in Table 2.

TABLE 2

|  | PAB (° C.) | PEB (° C.) | LWR (3 s, nm) |
|---|---|---|---|
| Example 1 | 130 | 130 | 9.20 |
| Example 2 | 130 | 130 | 8.26 |
| Comparative Example 1 | 130 | 130 | 12.46 |

As shown in Table 2, it was confirmed that the levels of LWR were favorably reduced in Examples 1 and 2 which used the aromatic organic solvent (S1) according to the present invention in comparison with Comparative Example 1 which used ethyl lactate.

In Examples according to the present invention, all of the resist pattern shape, mask linearity, and exposure margin were favorable in comparison with Comparative Example.

INDUSTRIAL APPLICABILITY

According to the present invention, a resist composition and a method of forming a resist pattern, in which the level of LWR is reduced, can be provided. Therefore, the present invention is industrially useful.

The invention claimed is:

1. A resist composition comprising a resin component (A) that displays changed alkali solubility under action of acid, an acid generator component (B) that generates acid upon exposure and an organic solvent (S), wherein
    the organic solvent (S) comprises an aromatic organic solvent (S1),
    wherein the aromatic organic solvent (S1) comprises anisole.

2. A resist composition according to claim 1, wherein the organic solvent (S) comprises an organic solvent (S2) other than the aromatic organic solvent (S1).

3. A resist composition according to claim 2, wherein the organic solvent (S2) comprises a propylene glycol monoalkyl ether acetate.

4. A resist composition according to claim 2, wherein the organic solvent (S2) comprises γ-butyrolactone.

5. A resist composition according to claim 1, further comprising a nitrogen-containing organic compound (D).

6. A method of forming a resist pattern, comprising:
    forming a resist film on a substrate using a positive resist composition according to any one of claims 1, 2, 3, 4 or 5;
    exposing the resist film; and
    developing the resist film to form a resist pattern.

* * * * *